(12) United States Patent
Scheuerlein et al.

(10) Patent No.: US 7,522,448 B2
(45) Date of Patent: *Apr. 21, 2009

(54) CONTROLLED PULSE OPERATIONS IN NON-VOLATILE MEMORY

(75) Inventors: Roy E. Scheuerlein, Cupertino, CA (US); Tanmay Kumar, Pleasanton, CA (US)

(73) Assignee: SanDisk 3D LLC, Milpitas, CA (US)

( * ) Notice: Subject to any disclaimer, the term of this patent is extended or adjusted under 35 U.S.C. 154(b) by 260 days.

This patent is subject to a terminal disclaimer.

(21) Appl. No.: 11/461,393

(22) Filed: Jul. 31, 2006

(65) Prior Publication Data

US 2008/0025076 A1    Jan. 31, 2008

(51) Int. Cl.
*G11C 11/00* (2006.01)

(52) U.S. Cl. .................. 365/163; 365/148; 365/175; 365/185.03; 365/185.18; 365/185.19; 365/185.22

(58) Field of Classification Search ................. 365/148, 365/163, 175, 185.03, 185.18, 185.19, 185.22
See application file for complete search history.

(56) References Cited

U.S. PATENT DOCUMENTS

| | | | |
|---|---|---|---|
| 4,698,589 A | 10/1987 | Blankenship et al. |
| 5,389,475 A | 2/1995 | Yanagisawa et al. |
| 5,818,749 A | 10/1998 | Harshfield |
| 5,978,277 A | 11/1999 | Hsu et al. |
| 6,034,882 A | 3/2000 | Johnson et al. |

(Continued)

FOREIGN PATENT DOCUMENTS

EP    1426971 A    6/2004

(Continued)

OTHER PUBLICATIONS

International Search Report and The Written Opinion of the International Search Authority, Patent Cooperation Treaty, Application No. PCT/US2007/074507 filed on Jul. 26, 2007, May 19, 2008.

(Continued)

*Primary Examiner*—VanThu Nguyen
(74) *Attorney, Agent, or Firm*—Vierra Magen Marcus & DeNiro LLP

(57) ABSTRACT

A passive element memory device is provided that includes memory cells comprised of a state change element in series with a steering element. Controlled pulse operations are used to perform resistance changes associated with set and reset operations in an array of memory cells. Selected memory cells in an array are switched to a target resistance state in one embodiment by applying a positive voltage pulse to selected first array lines while applying a negative voltage pulse to selected second array lines. An amplitude of voltage pulses can be increased while being applied to efficiently and safely switch the resistance of cells having different operating characteristics. The cells are subjected to reverse biases in embodiments to lower leakage currents and increase bandwidth. The amplitude and duration of voltage pulses are controlled, along with the current applied to selected memory cells in some embodiments. These controlled pulse-based operations can be used to set memory cells to a lower resistance state or reset memory cells to a higher resistance state in various embodiments.

23 Claims, 14 Drawing Sheets

U.S. PATENT DOCUMENTS

| | | |
|---|---|---|
| 6,306,718 B1 | 10/2001 | Singh et al. |
| 6,420,215 B1 | 7/2002 | Knall et al. |
| 6,483,734 B1 | 11/2002 | Sharma et al. |
| 6,567,287 B2 | 5/2003 | Scheuerlein |
| 6,795,338 B2 * | 9/2004 | Parkinson et al. ............ 365/163 |
| 6,856,536 B2 | 2/2005 | Rinerson et al. |
| 6,856,572 B2 | 2/2005 | Scheuerlein et al. |
| 6,862,213 B2 | 3/2005 | Hamaguchi |
| 6,873,561 B2 | 3/2005 | Ooishi |
| 6,879,505 B2 | 4/2005 | Scheuerlein |
| 6,891,749 B2 | 5/2005 | Campbell et al. |
| 6,952,030 B2 | 10/2005 | Herner et al. |
| 6,984,561 B2 | 1/2006 | Herner et al. |
| 7,005,350 B2 | 2/2006 | Walker et al. |
| 7,054,219 B1 | 5/2006 | Petti et al. |
| 7,057,922 B2 | 6/2006 | Fukumoto |
| 7,167,387 B2 | 1/2007 | Sugita et al. |
| 7,221,579 B2 | 5/2007 | Krusin et al. |
| 7,236,390 B1 * | 6/2007 | Chang et al. ............... 365/151 |
| 7,372,725 B2 * | 5/2008 | Philipp et al. ............... 365/163 |
| 2003/0001230 A1 | 1/2003 | Lowrey |
| 2003/0002332 A1 | 1/2003 | Lowrey |
| 2003/0073262 A1 | 4/2003 | Xu |
| 2003/0173612 A1 | 9/2003 | Krieger et al. |
| 2003/0218904 A1 | 11/2003 | Lowrey |
| 2004/0109377 A1 | 6/2004 | Ooishi |
| 2004/0114419 A1 | 6/2004 | Lowrey et al. |
| 2004/0129952 A1 | 7/2004 | Griesmer et al. |
| 2004/0160818 A1 | 8/2004 | Rinerson |
| 2004/0174756 A1 | 9/2004 | Kunikiyo et al. |
| 2004/0228159 A1 | 11/2004 | Kostylev et al. |
| 2004/0257882 A1 | 12/2004 | Stackhouse et al. |
| 2004/0264234 A1 | 12/2004 | Moore et al. |
| 2005/0018509 A1 | 1/2005 | Hush et al. |
| 2005/0052915 A1 | 3/2005 | Herner et al. |
| 2005/0098800 A1 | 5/2005 | Herner et al. |
| 2005/0121742 A1 | 6/2005 | Petti |
| 2005/0158950 A1 | 7/2005 | Scheuerlein et al. |
| 2005/0162883 A1 | 7/2005 | Nejad et al. |
| 2005/0167699 A1 | 8/2005 | Sugita et al. |
| 2005/0226067 A1 | 10/2005 | Herner et al. |
| 2005/0270883 A1 | 12/2005 | Cho et al. |
| 2006/0023532 A1 | 2/2006 | Hush et al. |
| 2006/0067117 A1 | 3/2006 | Petti |
| 2006/0071298 A1 | 4/2006 | Hui |
| 2006/0091373 A1 | 5/2006 | Lee et al. |
| 2006/0109704 A1 | 5/2006 | Seo et al. |
| 2006/0157679 A1 | 7/2006 | Scheuerlein |
| 2006/0157682 A1 | 7/2006 | Scheuerlein |
| 2006/0160307 A1 | 7/2006 | Joo et al. |
| 2006/0171194 A1 | 8/2006 | Lowrey et al. |
| 2006/0221734 A1 | 10/2006 | Bedeschi et al. |
| 2006/0250836 A1 * | 11/2006 | Herner et al. ............... 365/148 |
| 2006/0250837 A1 | 11/2006 | Herner et al. |
| 2006/0273298 A1 | 12/2006 | Petti |
| 2007/0002610 A1 | 1/2007 | Knall |
| 2007/0069276 A1 | 3/2007 | Scheuerlein et al. |
| 2007/0070690 A1 | 3/2007 | Scheuerlein et al. |
| 2007/0072360 A1 | 3/2007 | Kumar et al. |
| 2007/0090425 A1 | 4/2007 | Kumar et al. |
| 2007/0114509 A1 | 5/2007 | Herner et al. |
| 2007/0165442 A1 | 7/2007 | Hosoi et al. |
| 2007/0268742 A1 * | 11/2007 | Liu ............................ 365/163 |
| 2008/0023790 A1 | 1/2008 | Scheuerlein |
| 2008/0025061 A1 | 1/2008 | Scheuerlein et al. |
| 2008/0025062 A1 | 1/2008 | Scheuerlein et al. |
| 2008/0025066 A1 | 1/2008 | Fasoli et al. |
| 2008/0025067 A1 | 1/2008 | Scheuerlein et al. |
| 2008/0025068 A1 | 1/2008 | Scheuerlein et al. |
| 2008/0025069 A1 | 1/2008 | Scheuerlein et al. |
| 2008/0025078 A1 | 1/2008 | Scheuerlein et al. |
| 2008/0025085 A1 | 1/2008 | Scheuerlein et al. |
| 2008/0025088 A1 | 1/2008 | Scheuerlein et al. |
| 2008/0025089 A1 | 1/2008 | Scheuerlein et al. |
| 2008/0025093 A1 | 1/2008 | Scheuerlein et al. |
| 2008/0025094 A1 | 1/2008 | Scheuerlein et al. |
| 2008/0025118 A1 | 1/2008 | Scheuerlein |
| 2008/0025131 A1 | 1/2008 | Scheuerlein et al. |
| 2008/0025132 A1 | 1/2008 | Fasoli et al. |
| 2008/0025133 A1 | 1/2008 | Scheuerlein et al. |
| 2008/0025134 A1 | 1/2008 | Scheuerlein et al. |

FOREIGN PATENT DOCUMENTS

| | | |
|---|---|---|
| EP | 1755126 A | 2/2007 |
| WO | WO03/085675 A | 10/2003 |
| WO | WO2006/039370 A2 | 4/2006 |
| WO | WO2006/121837 A | 11/2006 |
| WO | WO2007/038665 A | 4/2007 |
| WO | WO2008/016844 A | 2/2008 |

OTHER PUBLICATIONS

Non-Final Office Action, United States Patent & Trademark Office, U.S. Appl. No. 11/461,424, filed Jul. 31, 2006, Aug. 9, 2007.

U.S. Appl. No. 11/461,399, filed Jul. 31, 2006.

Non-Final Office Action, United States Patent & Trademark Office, U.S. Appl. No. 11/461,399, filed Jul. 31, 2006, Nov. 14, 2008.

* cited by examiner selected WL selected BL selected WL selected BL

CONTROLLED PULSE OPERATIONS IN NON-VOLATILE MEMORY

CROSS-REFERENCE TO RELATED APPLICATIONS

The following related applications, filed on even date herewith, are cross-referenced and incorporated by reference herein in their entirety:

U.S. patent application Ser. No. 11/461,399, entitled "Systems for Controlled Pulse Operations in Non-Volatile Memory," filed concurrently;

U.S. patent application Ser. No. 11/461,410, entitled "High Bandwidth One Time Field-Programmable Memory," filed by Roy E. Scheuerlein and Christopher J. Petti;

U.S. patent application Ser. No. 11/461,419, entitled "Systems For High Bandwidth One Time Field-Programmable Memory," Roy E. Scheuerlein and Christopher J. Petti;

U.S. patent application Ser. No. 11/461,424, entitled "Reverse Bias Trim Operations in Non-Volatile Memory," by Roy E. Scheuerlein and Tanmay Kumar;

U.S. patent application Ser. No. 11/461,431, entitled "Systems for Reverse Bias Trim Operations in Non-Volatile Memory," by Roy E. Scheuerlein and Tanmay Kumar;

U.S. patent application Ser. No. 11/496,986, entitled "Method for Using a Memory Cell Comprising Switchable Semiconductor Memory Element With Trimmable Resistance," by Tanmay Kumar, S. Brad Hemer, Roy E. Scheuerlein, and Christopher J. Petti;

U.S. patent application Ser. No. 11/496,985, entitled "Multi-Use Memory Cell and Memory Array," by Roy E. Scheuerlein and Tanmay Kumar;

U.S. patent application Ser. No. 11/496,984, entitled "Method for Using a Multi-Use Memory Cell and Memory Array," by Roy E. Scheuerlein and Tanmay Kumar;

U.S. patent application Ser. No. 11/496,874, entitled "Mixed-Use Memory Array," by Roy E. Scheuerlein;

U.S. patent application Ser. No. 11/496,983, entitled "Method for Using a Mixed-Use Memory Array," by Roy E. Scheuerlein;

U.S. patent application Ser. No. 11/496,870, entitled "Mixed-Use Memory Array with Different Data States," by Roy E. Scheuerlein and Christopher J. Petti;

U.S. patent application Ser. No. 11/497,021, entitled "Method for Using a Mixed-Use Memory Array with Different Data States," by Roy E. Scheuerlein and Christopher J. Petti;

U.S. patent application Ser. No. 11/461,339 entitled "Passive Element Memory Array Incorporating Reversible Polarity Word Line and Bit Line Decoders," by Luca G. Fasoli, Christopher J. Petti, and Roy E. Scheuerlein;

U.S. patent application Ser. No. 11/461,364 entitled "Method for Using a Passive Element Memory Array Incorporating Reversible Polarity Word Line and Bit Line Decoders," by Luca G. Fasoli, Christopher J. Pefti, and Roy E. Scheuerlein;

U.S. patent application Ser. No. 11/461,343 entitled "Apparatus for Reading a Multi-Level Passive Element Memory Cell Array," by Roy E. Scheuerlein, Tyler Thorp, and Luca G. Fasoli;

U.S. patent application Ser. No. 11/461,367 entitled "Method for Reading a Multi-Level Passive Element Memory Cell Array," by Roy E. Scheuerlein, Tyler Thorp, and Luca G. Fasoli;

U.S. patent application Ser. No. 11/461,352 entitled "Dual Data-Dependent Busses for Coupling Read/Write Circuits to a Memory Array," by Roy E. Scheuerlein and Luca G. Fasoli;

U.S. patent application Ser. No. 11/461,369 entitled "Method for Using Dual Data-Dependent Busses for Coupling Read/Write Circuits to a Memory Array," by Roy E. Scheuerlein and Luca G. Fasoli;

U.S. patent application Ser. No. 11/461,359 entitled "Memory Array Incorporating Two Data Busses for Memory Array Block Selection," by Roy E. Scheuerlein, Luca G. Fasoli, and Christopher J. Petti;

U.S. patent application Ser. No. 11/461,372 entitled "Method for Using Two Data Busses for Memory Array Block Selection," by Roy E. Scheuerlein, Luca G. Fasoli, and Christopher J. Petti;

U.S. patent application Ser. No. 11/461,362 entitled "Hierarchical Bit Line Bias Bus for Block Selectable Memory Array," by Roy E. Scheuerlein and Luca G. Fasoli; and U.S. patent application Ser. No. 11/461,376 entitled "Method for Using a Hierarchical Bit Line Bias Bus for Block Selectable Memory Array," by Roy E. Scheuerlein and Luca G. Fasoli.

BACKGROUND OF THE INVENTION

1. Field of the Invention

Embodiments in accordance with the present disclosure are directed to integrated circuits containing non-volatile memory cell arrays and particularly those arrays incorporating passive element memory cells.

2. Description of the Related Art

Materials having a detectable level of change in state, such as a resistance or phase change, are used to form various types of non-volatile semiconductor based memory devices. For example, simple antifuses are used for binary data storage in one time field-programmable (OTP) memory arrays by assigning a lower resistance initial physical state of a memory cell to a first logical state such as logical '0,' and assigning a higher resistance physical state of the cell to a second logical state such as logical '1.' Some materials can have their resistance switched back in the direction of their initial resistance. These types of materials can be used to form re-writable memory cells. Multiple levels of detectable resistance in materials can further be used to form multi-state devices which may or may not be re-writable.

Materials having a memory effect such as a detectable level of resistance are often placed in series with a steering element to form a memory cell. Diodes or other devices having a non-linear conduction current are typically used as the steering element. The memory effect of the cell is often referred to as the state change element. In many implementations, a set of word lines and bit lines are arranged in a substantially perpendicular configuration with a memory cell at the intersection of each word line and bit line. Two-terminal memory cells can be constructed at the intersections with one terminal (e.g., terminal portion of the cell or separate layer of the cell) in contact with the conductor forming the respective word line and another terminal in contactor with the conductor forming the respective bit line. Such cells are sometimes referred to as passive element memory cells.

In some cases, bias conditions during read and write operations are an important consideration when implementing non-volatile memory arrays having passive element memory cells comprising switchable resistance materials or phase change materials as the state change element. High bias conditions applied to program these cells can restrict the endurance of the steering element. High leakage currents, program disturbances, read disturbances, etc. can pose difficulties when attempting to produce a memory device comprising one or more arrays of passive element memory cells that can be reliably fabricated, programmed, and read. Moreover, slight differences between individual memory cells can pose difficulty when attempting to program multiple cells individually or concurrently.

SUMMARY OF THE INVENTION

A passive element memory device is provided that includes memory cells comprised of a state change element in series with a steering element. Controlled pulse operations are used to perform resistance changes associated with set and reset operations in an array of memory cells. Selected memory cells in an array are switched to a target resistance state in one embodiment by applying a positive voltage pulse to selected first array lines while applying a negative voltage pulse to selected second array lines. An amplitude of voltage pulses can be increased while being applied to efficiently and safely switch the resistance of cells having different operating characteristics. The cells are subjected to reverse biases in embodiments to lower leakage currents and increase bandwidth. The amplitude and duration of voltage pulses are controlled, along with the current applied to selected memory cells in some embodiments. These controlled pulse-based operations can be used to set memory cells to a lower resistance state or reset memory cells to a higher resistance state in various embodiments.

A reverse bias can be applied to a memory cell to switch it from a first resistance state to a second resistance state in one embodiment. The amount of reverse bias can be increased for a selected set of memory cells to account for variances in the erase behavior of particular memory cells. One or more gradually increasing voltage pulses can be applied to selected word lines and/or bit lines to allow different cells to reset at various levels of applied reverse bias. Damage to cells that reset earlier is avoided while providing sufficient bias for harder to reset cells. Retry pulses can be incorporated in one or more embodiments but are not required.

In one embodiment, a method of changing data states in a non-volatile memory integrated circuit is provided that includes applying at least one voltage pulse to a non-volatile memory cell including a steering element in series with a state change element, changing an amplitude of the at least one voltage pulse during the applying to increase an amount of bias applied to the non-volatile memory cell, and changing a resistance of the non-volatile memory cell from a first resistance state to a second resistance state by applying the at least one voltage pulse.

A method of changing data states in a non-volatile memory integrated circuit is provided in one embodiment that includes reverse biasing a non-volatile memory cell having a resistance change element in series with a steering element, and changing a resistance of the resistance change element by applying at least one positive voltage pulse at a first terminal portion of the memory cell while applying at least one negative voltage pulse at a second terminal portion of the memory cell with the memory cell reverse biased.

In another embodiment, a method of changing data states in non-volatile memory is provided that includes applying at least one voltage pulse to a non-volatile memory cell including a steering element in series with a state change element to reverse bias the non-volatile memory cell, controlling the at least one voltage pulse during the applying to provide a predetermined amplitude and duration of the pulse, controlling a current applied to the non-volatile memory cell to a predetermined level when applying the at least one voltage pulse, and changing a resistance of the non-volatile memory cell from a first resistance state to a second resistance state by applying and controlling the at least one voltage pulse.

A non-volatile memory device is provided in one embodiment that includes a plurality of first array lines, a plurality of second array lines substantially perpendicular to the plurality of first array lines, and a plurality of non-volatile memory cells including a steering element in series with a state change element. Each memory cell is arranged between one of the first array lines and one of the second array lines. The plurality of memory cells include a subset of memory cells arranged between selected first array lines and selected second array lines and subjected to a bias during an operation to switch the subset of memory cells from a first resistance state to a second resistance state. The operation includes at least one voltage pulse having an amplitude that changes to increase the bias for the subset of memory cells.

DETAILED DESCRIPTION

Figure 1:
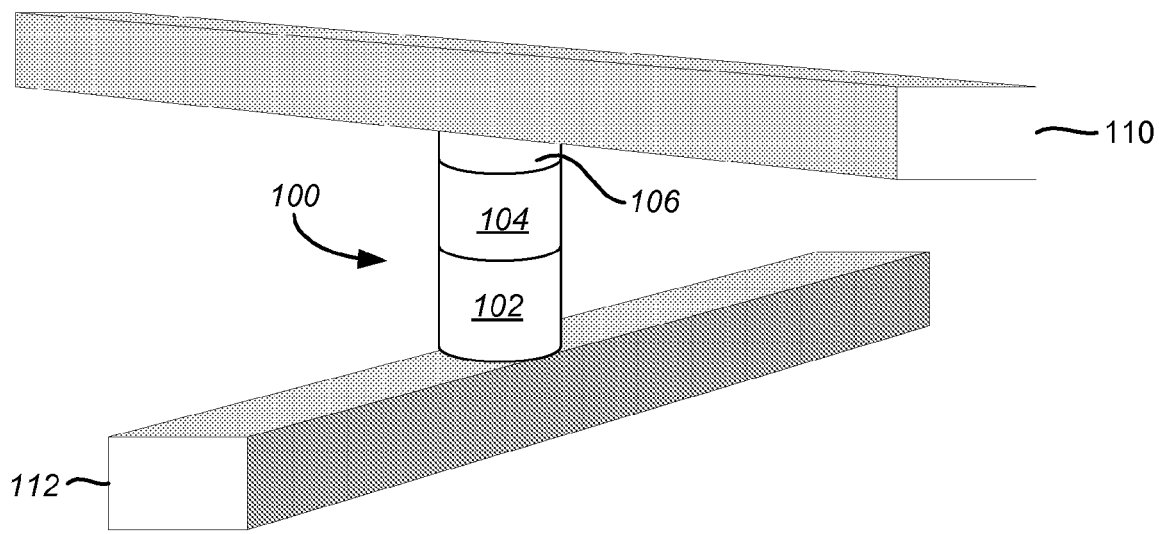
FIG. 1 depicts an exemplary non-volatile memory cell in accordance with one embodiment.

FIG. 1 depicts an exemplary structure for a non-volatile memory cell that can be used in accordance with embodiments of the present disclosure. A two-terminal memory cell 100 as depicted in FIG. 1 includes a first terminal portion connected to a first conductor 110 and a second terminal portion connected to a second conductor 112. The memory cell includes a steering element 102 in series with a state change element 104 and an anti-fuse 106 to provide non-volatile date storage. The steering element can take the form of any suitable device exhibiting a nonlinear conduction current characteristic such as a simple diode. The state change element will vary by embodiment and can include numerous types of materials to store data through representative physical states. State change element 104 can include resistance change materials, phase change resistive materials, etc. For example, a semiconductor or other material having at least two levels of detectable resistance change (e.g., low to high and high to low) is used in one embodiment to form a passive storage element 100. By assigning logical data values to the various levels of resistance that can be set and read from resistance change element 104, memory cell 100 can provide reliable data read/write capabilities. Anti-fuse 106 can further provide resistance state change abilities that can be exploited for non-volatile data storage. An anti-fuse is manufactured in a high resistance state and can be popped or fused to a lower resistance state. An anti-fuse is typically non-conductive in its initial state and exhibits high conductivity with low resistance in its popped or fused state. As a discreet device or element may have a resistance and different resistance states, the terms resistivity and resistivity state are used to refer to the properties of materials themselves. Thus, while a resistance change element or device may have resistance states, a resistivity change material may have resistivity states.

Anti-fuse 106 can provide benefits to memory cell 100 beyond its state change ability. For example, an anti-fuse can serve to set the on-resistance of the memory cell in at an appropriate level relative to the read-write circuitry associated with the cell. These circuits are typically used to pop the anti-fuse and have an associated resistance. Because these circuits drive the voltages and current levels to pop the anti-fuse, the anti-fuse tends to set the memory cell in an appropriate on-resistance state for these same circuits during later operations.

It will be appreciated that other types of two-terminal non-volatile memory cells can be used in embodiments. For example, one embodiment does not have an anti-fuse 106 and merely includes state change element 104 and steering element 102. Other embodiments may include additional state change elements in place of or in addition to the anti-fuse. Various types of suitable memory cells are described in U.S. Pat. No. 6,034,882 entitled "Vertically Stacked Field Programmable Non-volatile Memory and Method of Fabrication." Various other types of cells may be used, including those described in U.S. Pat. No. 6,420,215 and U.S. patent application Ser. No. 09/897,705 entitled "Three-Dimensional Memory Array Incorporating Serial Chain Diode Stack" filed on Jun. 29, 2001, and U.S. patent application Ser. No. 09/560,626 entitled "Three-Dimensional Memory Array and Method of Fabrication" filed on Apr. 28, 2000, all hereby incorporated by reference in their entirety.

A variety of materials exhibit resistivity change behavior suitable for implementing state change element 104 in accordance with embodiments of the present disclosure. Examples of suitable materials for resistance state change element 104 include, but are not limited to doped semiconductors (e.g., polycrystalline silicon, more commonly polysilicon), transition metal oxides, complex metal oxides, programmable metallization connections, phase change resistive elements, organic material variable resistors, carbon polymer films, doped chalcogenide glass, and Schottky barrier diodes containing mobile atoms that change resistance. The resistivity of these materials in some cases may only be set in a first direction (e.g., high to low), while in others, the resistivity may be set from a first level (e.g., higher resistance) to a second level (e.g., lower resistance), and then reset back to the first resistivity level.

A range of resistance values can be assigned to a physical data state to accommodate differences amongst devices as well as variations within devices after set and reset cycling. The terms set and reset are typically used, respectively, to refer to the process of changing an element from a high resistance physical state to a low resistance physical state (set) and changing an element from a low resistance physical state to a higher resistance physical state (reset). Embodiments in accordance with the present disclosure can be used to set memory cells to a lower resistance state or to reset memory cells to a higher resistance state. While specific examples may be provided with respect to set or reset operations, it will be appreciated that these are mere examples and that the disclosure is not so limited.

Conductors 110 and 112 are typically orthogonal to one another and form array terminal lines for accessing an array of memory cells 100. The array terminal lines (also called array lines) at one layer may be termed word lines or X-lines. The array lines at a vertically adjacent layer may be termed bit lines or Y-lines. A memory cell can be formed at the projected intersection of each word line and each bit line, and connected between the respective intersecting word line and bit line as shown for the formation of memory cell 100. A three-dimensional memory array which has at least two levels of memory cells (i.e., two memory planes) may utilize more than one layer of word lines and/or more than one layer of bit lines. A monolithic three dimensional memory array is one in which multiple memory levels are formed above a single substrate, such as a wafer, with no intervening substrates.

Figure 2A:
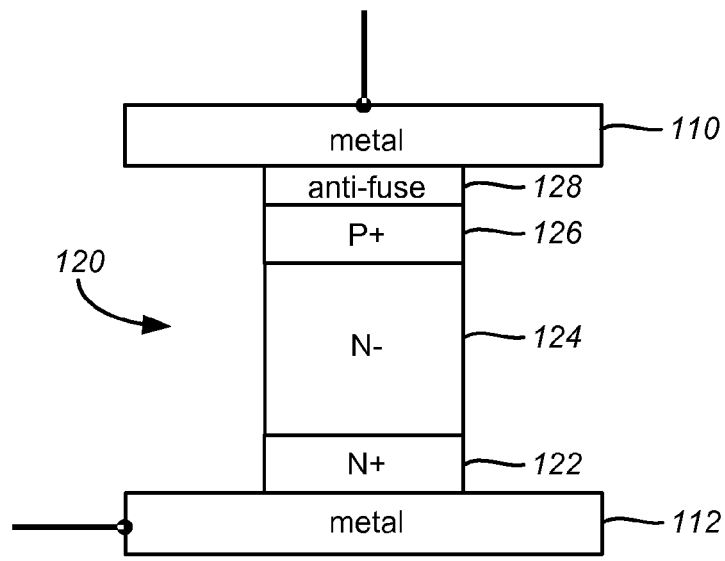
FIGS. 2A and 2B depict exemplary non-volatile memory cells in accordance with one embodiment.
Figure 2B:
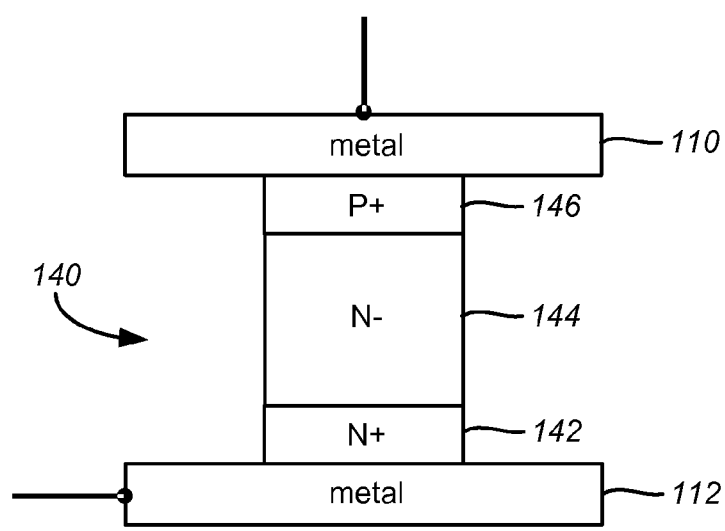

FIGS. 2A and 2B are more detailed depictions of exemplary memory cells that may be used in various embodiments. In FIG. 2A, memory cell 120 is formed between first and second metal conductive layers 110 and 112. The memory cell includes a p-i-n type diode having a heavily doped n-type region 122, intrinsic region 124, and a heavily doped p-type region 126. In other embodiment, region 122 can be p-type and region 126 n-type. Region 124 is intrinsic, or not intentionally doped, though in some embodiments it may be lightly doped. Undoped regions may not be perfectly electrically neutral, resulting from defects, contaminants, etc. that may cause it to behave as if slightly n-doped or p-doped. Such a diode is still considered a p-i-n type diode having an intrinsic middle layer. Other types of diodes such as p-n junction diodes can also be used.

Between doped p-type region 126 and conductor 110 is an anti-fuse 128. Anti-fuse 128 exhibits substantially non-conductive properties in its initial state and substantially conductive properties in its set state. Various types of anti-fuses can be used in accordance with embodiments. In typically fabricated anti-fuses, a large bias applied across the anti-fuse will fuse the forming material causing the anti-fuse to become substantially conductive. This operation is typically referred to as popping the anti-fuse.

Memory cell 120 further includes a state change element that is formed from one or more layers of the diode. It has been discovered that materials used to form the diodes in some memory cells themselves exhibit resistive change abilities. For example, in one embodiment the intrinsic region of the diode is formed of polysilicon which has demonstrated abilities to be set from a higher resistivity state to a lower resistivity state, and then reset back to a higher resistivity state from the lower resistivity state. Accordingly, the diode itself, or a portion thereof, may also form the state change element 104 as illustrated in FIG. 1. In other embodiments, one or more additional layers may be included in memory cell 120 to form a state change element as shown in FIG. 1. For example, an additional layer of polysilicon, transition metal oxide, etc. as described above may be included in the cell to provide a state change memory effect. This additional layer may be included between the diode and conductor 112, between the diode and the anti-fuse 128, or between the anti-fuse and conductor 110.

FIG. 2B illustrates a simple memory cell configuration where an anti-fuse 128 is not present. Memory cell 140 simply includes heavily doped n-type region 142, intrinsic region 144, and heavily doped p-type region 146. One or more layers of the diode formed from these regions serves as the memory effect for the cell as described above. Memory cell 140 could also include other layers to form an additional state change element for the cell in one embodiment.

Figure 3A:
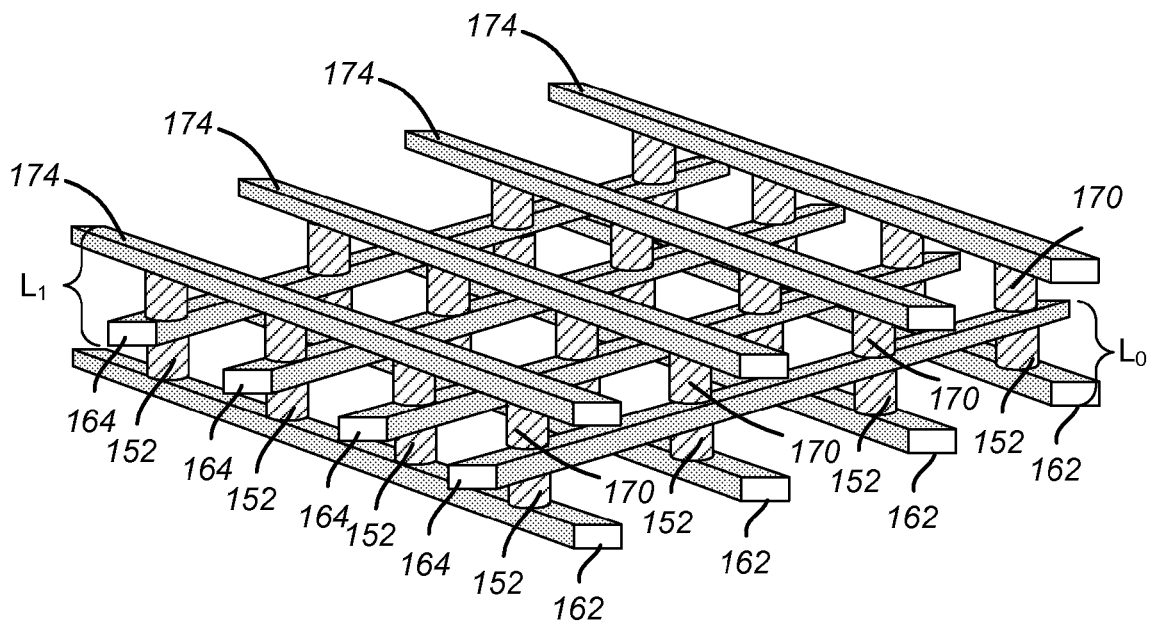
FIGS. 3A and 3B are respective perspective and cross-sectional views of a three-dimensional memory array in accordance with one embodiment.
Figure 3B:
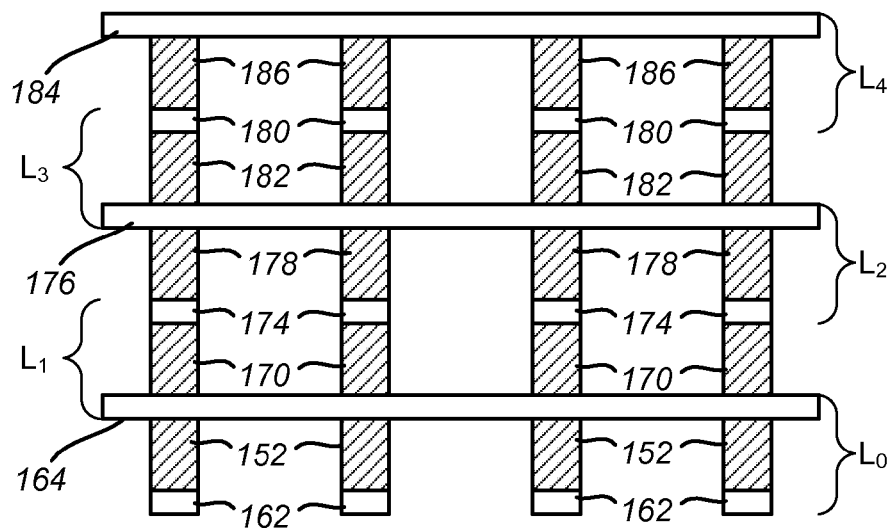

FIGS. 3A-3B depict a portion of an exemplary monolithic three-dimensional memory array as can be used in one embodiment. However, other memory structures can be used in accordance with various embodiments, including two-dimensional memory structures manufactured on, above, or within a semiconductor substrate. Both the word line and bit line layers are shared between memory cells in the structure depicted in the perspective view of FIG. 3A. This configuration is often referred to as a fully mirrored structure. A plurality of substantially parallel and coplanar conductors form a first set of bit lines 162 at a first memory level L0. Memory cells 152 at level L0 are formed between these bit lines and adjacent word lines 164. In the arrangement of FIGS. 3A-3B, word lines 164 are shared between memory layers L0 and L1 and thus, further connect to memory cells 170 at memory level L1. A third set of conductors form the bit lines 174 for these cells at level L1. These bit lines 174 are in turn shared between memory levels L1 and memory level L2, depicted in the cross-sectional view of FIG. 3B. Memory cells 178 are connected to bit lines 174 and word lines 176 to form the third memory level L2, memory cells 182 are connected to word lines 176 and bit lines 180 to form the fourth memory level L3, and memory cells 186 are connected to bit lines 180 and word lines 184 to form the fifth memory level L5. The arrangement of the diodes' polarity and the respective arrangement of the word lines and bit lines can vary by embodiment. Additionally, more or less than five memory levels can be used.

If p-i-n diodes are used as steering elements for the memory cells in the embodiment of FIG. 3A, the diodes of memory cells 170 can be formed upside down relative to the p-i-n diodes of the first level of memory cells 152. For example, if cells 152 include a bottom heavily doped region that is n-type and a top heavily doped region that is p-type, then in the second level of cells 170, the bottom heavily doped region may be p-type while the top heavily doped region is n-type.

In an alternative embodiment, an inter-level dielectric can be formed between adjacent memory levels. No conductors are shared between memory levels. This type of structure for three-dimensional monolithic storage memory is often referred to as a non-mirrored structure. In some embodiments, adjacent memory levels that share conductors and adjacent memory levels that do not share conductors can be stacked in the same monolithic three dimensional memory array. In other embodiments, some conductors are shared while others are not. For example, only the word lines or only the bit lines can be shared in some configurations. A first memory level L0 can include memory cells between a bit line level BL0 and word line level WL0. The word lines at level WL0 can be shared to form cells at a memory level L1 that connect to a second bit line level BL1. The bit line layers are not shared so the next layer can include an interlayer dielectric to separate bit lines BL1 from the next level of conductors. This type of configuration is often referred to as half-mirrored. Memory levels need not all be formed having the same type of memory cell. If desired, memory levels using resistive change materials can alternate with memory levels using other types of memory cells, etc.

In one embodiment as described in U.S. Pat. No. 7,054,219, entitled, "Transistor Layout Configuration for Tight Pitched Memory Array Lines," word lines are formed using word line segments disposed on different word line layers of the array. The segments can be connected by a vertical connection to form an individual word line. A group of word lines, each residing on a separate layer and substantially vertically-aligned (notwithstanding small lateral offsets on some layers), may be collectively termed a row. The word lines within a row preferably share at least a portion of the row address. Similarly, a group of bit lines, each residing on a separate layer and substantially vertically-aligned (again, notwithstanding small lateral offsets on some layers), may be collectively termed a column. The bit lines within a column preferably share at least a portion of the column address.

Figure 4:
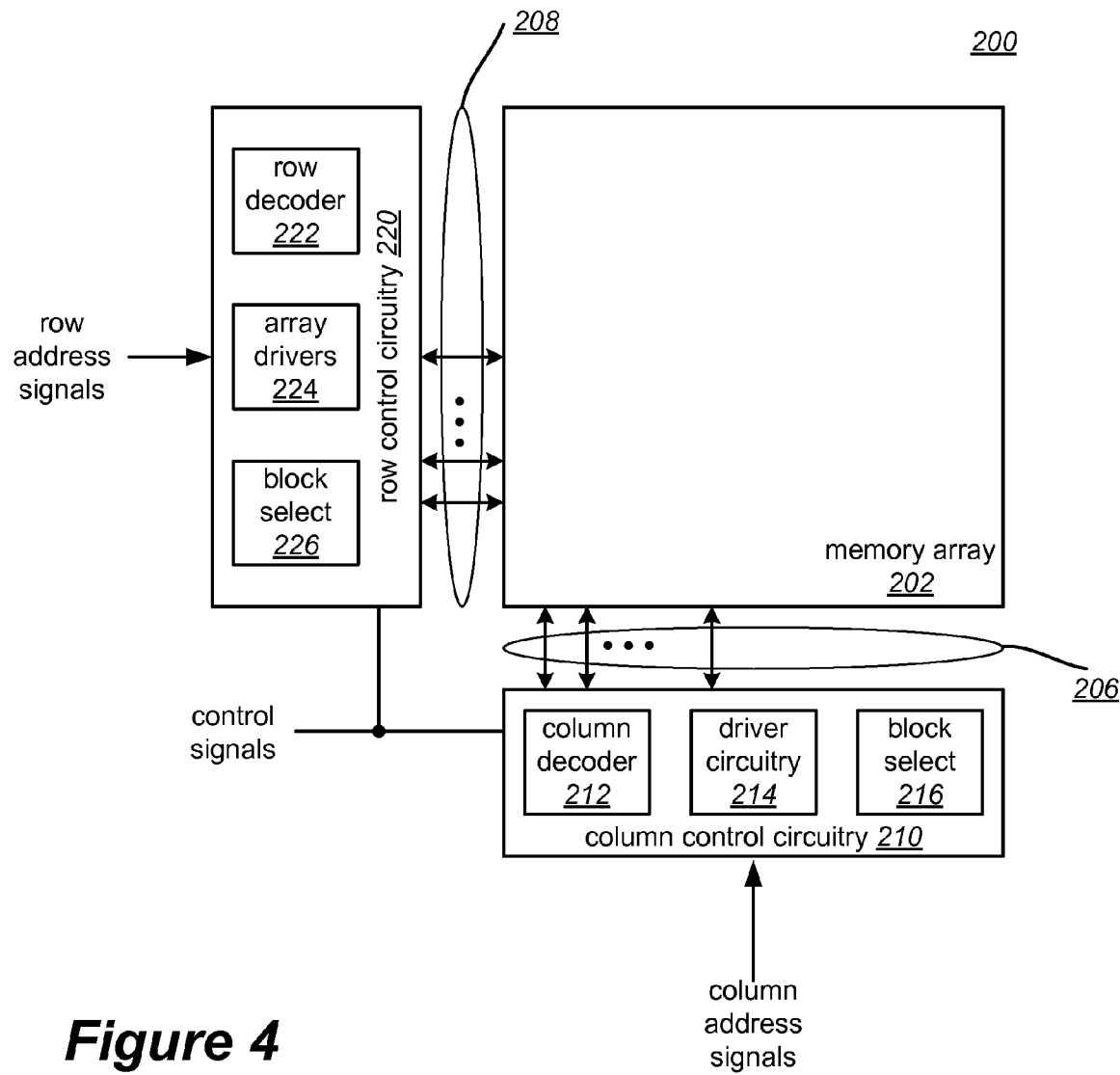
FIG. 4 is block diagram of a non-volatile memory system in accordance with one embodiment.

FIG. 4 is a block diagram of an integrated circuit including a memory array 202. The array terminal lines of memory array 202 include the various layer(s) of word lines organized as rows, and the various layer(s) of bit lines organized as columns. The integrated circuit 200 includes row control circuitry 220 whose outputs 208 are connected to respective word lines of the memory array 202. The row control circuitry receives a group of M row address signals and one or more various control signals, and typically may include such circuits as row decoders 222, array terminal drivers 224, and block select circuitry 226 for both read and write (i.e., programming) operations. The integrated circuit 200 also includes column control circuitry 210 whose input/outputs 206 are connected to respective bit lines of the memory array 202. The column control circuitry 206 receives a group of N column address signals and one or more various control signals, and typically may include such circuits as column decoders 212, array terminal receivers or drivers 214, block select circuitry 216, as well as read/write circuitry, and I/O multiplexers. Circuits such as the row control circuitry 220 and the column control circuitry 210 may be collectively termed control circuitry or array terminal circuits for their connection to the various array terminals of the memory array 202.

Integrated circuits incorporating a memory array usually subdivide the array into a sometimes large number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

Figure 5:
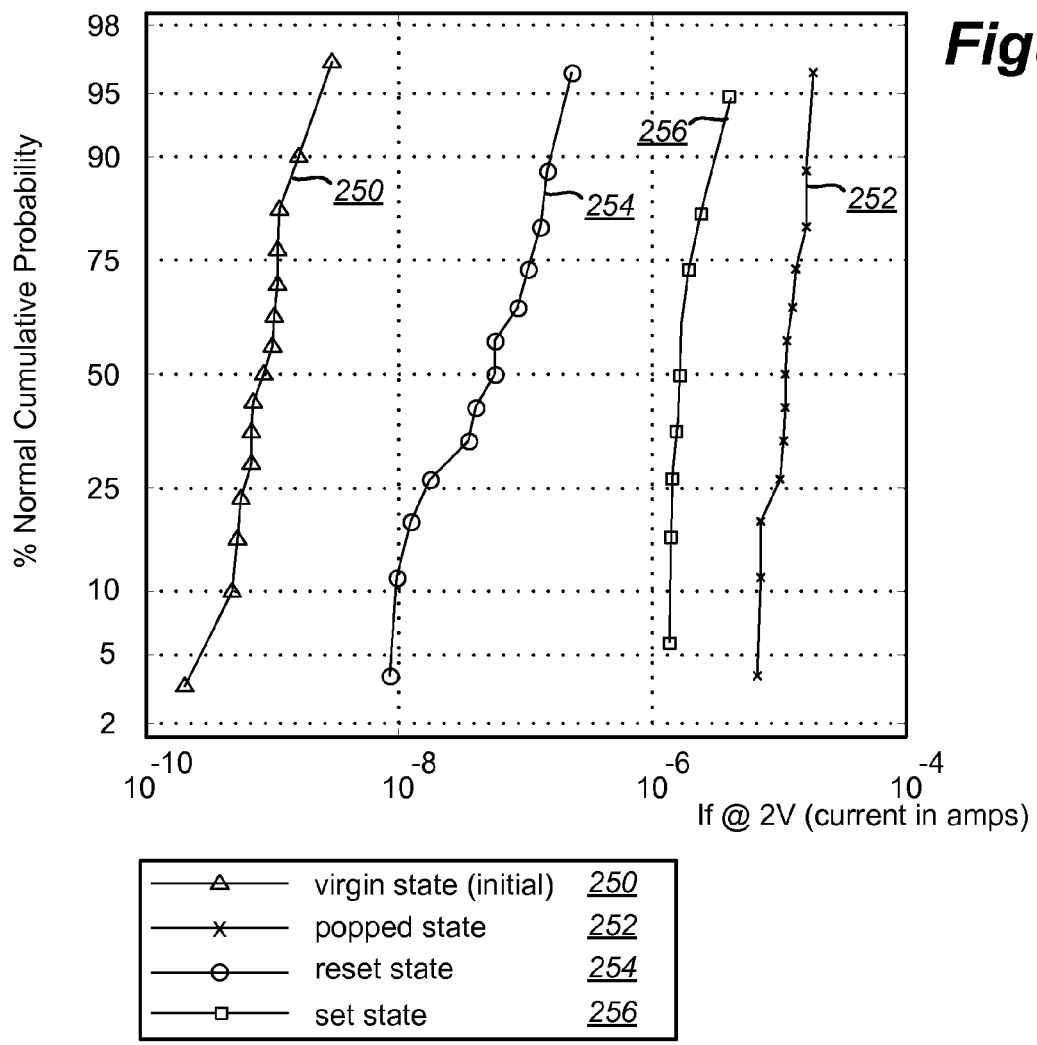
FIG. 5 is a graph depicting the distributions of resistance for the various states of a non-volatile memory system in accordance with one embodiment.

FIG. 5 is a graph depicting the distribution of resistance for the states of a set of memory cells in a non-volatile memory system in accordance with one embodiment. The exemplary memory system depicted in FIG. 5 utilizes four resistance states, although embodiments in accordance with the present disclosure can be used with systems utilizing a different number and/or combination of resistance states. The virgin (or initial) state of the set of memory cells is depicted by line 250. The distribution of resistance for these cells in their initial states after fabrication is shown as a probability function based on the cell's conduction current under a selected voltage bias (e.g., 2V). The virgin state of the cells after fabrication is a higher resistance state, having a conduction current of about $10^{-10}$ A to $10^{-9}$ A under the selected voltage.

A popped state of the device is depicted at line 252. State 252 corresponds to a lowest resistance state of the device. The devices in state 252 exhibit a conduction current of about $10^{-5}$ A under the applied voltage level of 2V depicted in FIG. 5. Memory cells can be set from their highest resistance initial state to the lowest resistance popped state by popping an anti-fuse in one embodiment. In other embodiments, a resistivity of a resistance change material such as polysilicon or a metal oxide can be switched to set cells into this lower resistance state. In one embodiment, popping an anti-fuse to set devices into a popped state as depicted at line 252 includes applying a large forward bias to the cells, such as about 8V. Other techniques, bias conditions, and/or voltage levels can also be used for these operations.

Line 254 depicts the distribution of resistance for the set of memory cells after being reset to a higher resistance reset state from the lower resistance state depicted at line 252. Memory cells in this reset state exhibit a conduction current of about $10^{-8}$ A to $10^{-7}$ A under the applied 2V voltage level. The reset state is at a lower resistance than the higher resistance initial state but in other embodiments could be at a higher resistance. A reverse bias reset operation as described hereinafter can be used in one embodiment to reset the resistance of the memory cells from state 252 to state 254. For example, the resistivity of a resistivity change material in each cell can be increased by subjecting the memory cells to a reverse bias voltage on the order of about −10V to −12V in one embodiment.

Line 256 depicts a set state of the memory cells. Memory cells may be set from their higher resistance reset state 254 to a lower resistance set state 256. Memory cells in set state 256 have a conduction current of about $10^{-6}$ A under the applied 2V voltage level. The resistance of cells in set state 256 is higher than that of the cells when in popped state 254, but lower than that of the cells in reset state 254. A forward bias of about +8V can be used in one embodiment to switch the resistance of a memory cell from reset state 254 to set state 256. In other embodiments, other bias conditions and/or voltage levels can be used for setting the memory cells.

The four resistance states depicted in FIG. 5 can be used to form a variety of types of memory systems. In one embodiment, the reset state transition is used for a field-programming operation in a one-time programmable memory array. A memory cell incorporating a resistance change element is factory-set to lower resistance state 252 from initial state 250. The memory array including the memory cell is then provided to an end-user. The lower resistance state obtained by setting the cell from its higher resistance initial state during manufacturing corresponds to a formatted or unprogrammed state of the cell. Circuitry is provided with the memory array to reset selected memory cells to higher resistance state 254 in accordance with data received from an end-user or host device in communication with the memory cell.

The four resistance states are used to form a multi-state memory system in another embodiment. Memory cells can be programmed from initial state 250 to any of states 252, 254, or 256 (or left in state 250) in accordance with user data. Each cell can store 2 bits of data in one such embodiment. A re-writable memory system can be formed in another embodiment. Cells can be set to state 256 and then reset back to state 254 multiple times to form a one bit re-writable array. Other types of memory systems can also be used in accordance with embodiments, including by way of non-limiting example, U.S. patent application Ser. No. 11/496,985, entitled "Multi-Use Memory Cell and Memory Array," U.S. patent application Ser. No. 11/496,874, entitled "Mixed-Use Memory Array," U.S. patent application Ser. No. 11/496,870, entitled "Mixed-Use Memory Array with Different Data States," and U.S. patent application Ser. No. 11/496,986, entitled Method For Using A Memory Cell Comprising Switchable Semiconductor Memory Element with Trimmable Resistance." Biasing arrays of two-terminal memory cells for reading, setting, or resetting states can give rise to program disturbances, read disturbances, as well as high leakage currents that can affect power consumption as well as the reliability of the read and programming operations. For example, when selecting particular memory cells within an array for particular operations, the bias conditions may cause inadvertent leakage currents through unselected memory cells. These leakage currents may be present despite the use of steering elements within the memory array. The diodes of unselected memory cells may conduct small amounts of current when subjected to small positive or negative bias conditions.

Consider a forward bias reset operation implemented in some two-terminal memory arrays as an erase operation, for example. With the steering elements configured from bit line to word line, a large positive bias is created by applying a large voltage to a selected bit line and a low voltage or ground condition to a selected word line. Unselected bit lines may be at a small positive bias and unselected word lines at a large positive bias. With the memory array biased in this manner, unacceptable levels of leakage currents through the half-selected cells along the selected word line or bit line as well as through the unselected cells along an unselected word line and bit line may be present in some cases. Likewise, unacceptable levels of leakage currents may occur during a forward bias set operation as may be used for programming an array of memory cell. The cumulative effect of small leakage currents through unselected cells limits the numbers of selected memory cells that can be operated upon at one time.

It has been discovered that a reverse bias can be applied to memory cells with resistance change elements to alter a detectable resistance of the cell. Materials such as metal oxides, polysilicon, etc. described above, can be reset from a lower resistivity state to a higher resistivity state, for example, by subjecting the material to a voltage pulse that creates a reverse bias across the material. A reverse bias is applied during a reset operation in one embodiment to minimize leakage currents through the memory array. An essentially zero bias can be provided to certain unselected memory cells in some implementations. Because the leakage currents are minimized, a larger number of memory cells can be selected for reset operations. This provides an improvement to operational specifications by decreasing programming and/or erase times. Moreover, the low leakage currents can facilitate more reliable operations by normalizing device performance within expected levels. U.S. patent application Ser. No. 11/461,339 entitled "Passive Element Memory Array Incorporating Reversible Polarity Word Line and Bit Line Decoders," discloses a reverse bias operation that can be used to minimize leakage currents through unselected and half-selected memory cells.

A reset operation is used in one exemplary embodiment to switch selected memory cells from a lower resistivity set state to a higher resistivity initial state. In one embodiment, the reset operation can be used to erase the selected memory cells as may be applicable in a re-writable memory cell, while in another embodiment the reset operation can be used to program the selected memory cells, as may be applicable in a write-once memory implementation such as that described in U.S. patent application Ser. No. 11/461,410, entitled, "High Bandwidth One Time Field-Programmable Memory."

Figure 6:
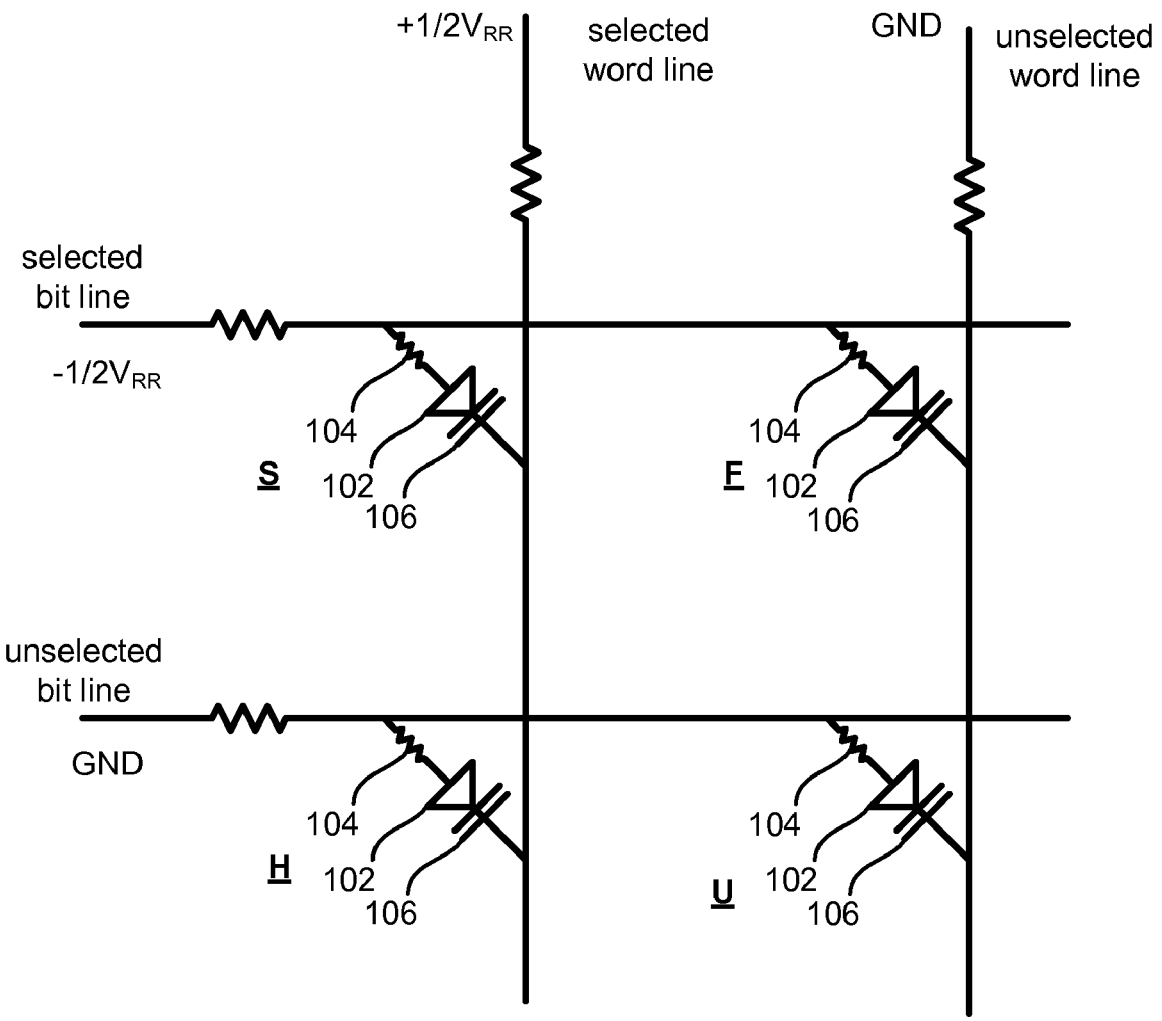
FIG. 6 is a simplified circuit diagram of a memory array illustrating the bias conditions for a reverse bias reset operation in accordance with one embodiment.

FIG. 6 is a circuit diagram of a portion of a memory array during a reverse bias operation in accordance with one embodiment. The reverse bias conditions can be used to set memory cells to a low resistance state or reset memory cells to a high resistance state. Specific reference to a reset operation may be made hereinafter for convenience but is not meant as a limitation on application of the disclosed biases and techniques. One or more selected word lines are at a positive bias and one or more selected bit lines are at a negative bias. For example, the selected word lines may receive a reset voltage signal $V_{WR}$ of $+\frac{1}{2}V_{RR}$, while the selected bit lines are driven at a negative bias of about $-\frac{1}{2}V_{RR}$ through reset voltage signal $V_{BR}$. $V_{RR}$ is the amount of reverse bias (or negative voltage) needed to reset the memory and can vary by embodiment. In one exemplary implementation $V_{RR}$ is about 12V such that the selected word lines receive +6V and the selected bit lines receive −6V to create the 12V reverse bias level. The unselected word lines and bit lines are both grounded. The steering elements for the selected memory cells (denoted S) are reverse biased, passing a reverse current through the resistance change material for the selected cells. Under this reverse bias condition, the resistance change material switches from a first resistance state to a second resistance state.

The bias conditions depicted in FIG. 6 advantageously provide a zero bias condition for the unselected cells (denoted U). Thus, low leakage currents through unselected and half-selected memory cells during program operations can be achieved. F denotes a half selected memory cell along a selected bit line and H denotes a half-selected memory cell along a selected word line. Additionally, the selected levels of $+/-\frac{1}{2}V_{RR}$ for the selected array lines provide less load on the driver circuitry necessary to generate the voltage level for the reverse bias reset operation. By splitting the bias using positive and negative voltage levels across the array lines, the driver circuitry need only generate half the overall voltage level required in some implementations.

Other bias conditions may also be used to reverse bias the selected memory cells for a reset operation. In one embodiment for example, a positive voltage bias (e.g., $V_{RR}$) can be applied to the selected word line and the selected bit line grounded. The unselected word and bit lines each can receive $+\frac{1}{2}V_{RR}$. This bias scenario will also provide a reverse bias to the selected memory cells that can be used to switch the cells' resistance. More information regarding reverse bias operations can be found in U.S. patent application Ser. No. 11/461,339 entitled "Passive Element Memory Array Incorporating Reversible Polarity Word Line and Bit Line Decoders."

Because the leakage currents are reduced under the reverse bias conditions depicted in FIG. 6, an increased number of cells may be selected during the set or reset operations. For example, in one embodiment including 32 sense amplifiers connected to a block of cells by source selection buses where each bay includes 16 blocks, one (or in other cases more than one) block from each bay of many bays in the memory (e.g., 16 to 2048 bays or more) may be selected during a reset operation while maintaining reasonable levels of reverse current leakage. U.S. patent application Ser. No. 11/461,359 entitled "Memory Array Incorporating Two Data Busses for Memory Array Block Selection," and U.S. patent application Ser. No. 11/461,362 entitled "Hierarchical Bit Line Bias Bus for Block Selectable Memory Array," describe techniques for increased parallel access to a memory array such as array 302.

Figure 7A:
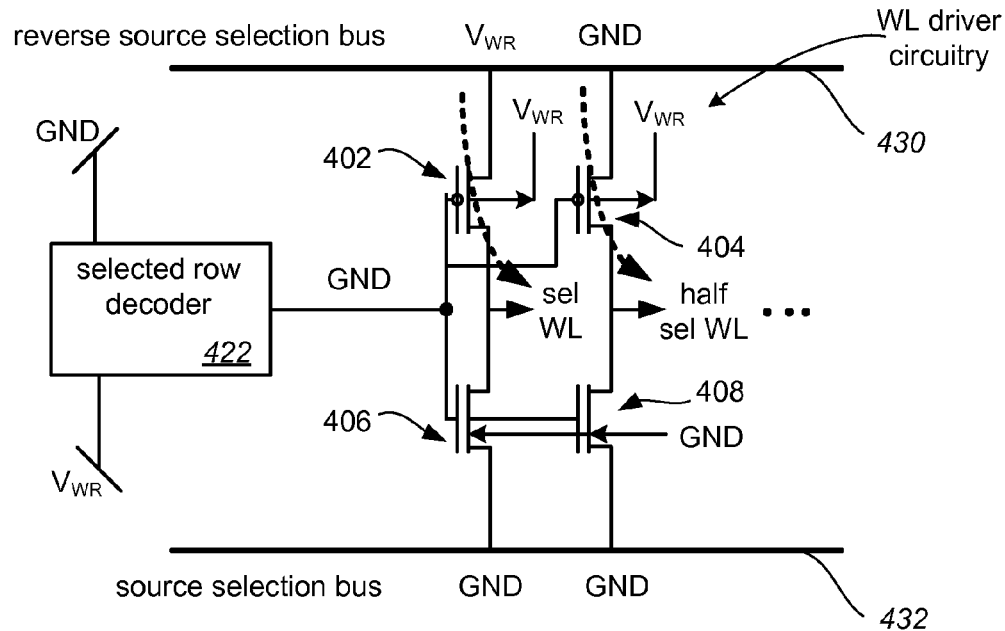
FIGS. 7A and 7B are circuit diagrams of a portion of row control circuitry that can be used in accordance with one embodiment to provide the reverse bias reset conditions of FIG. 6.
Figure 7B:
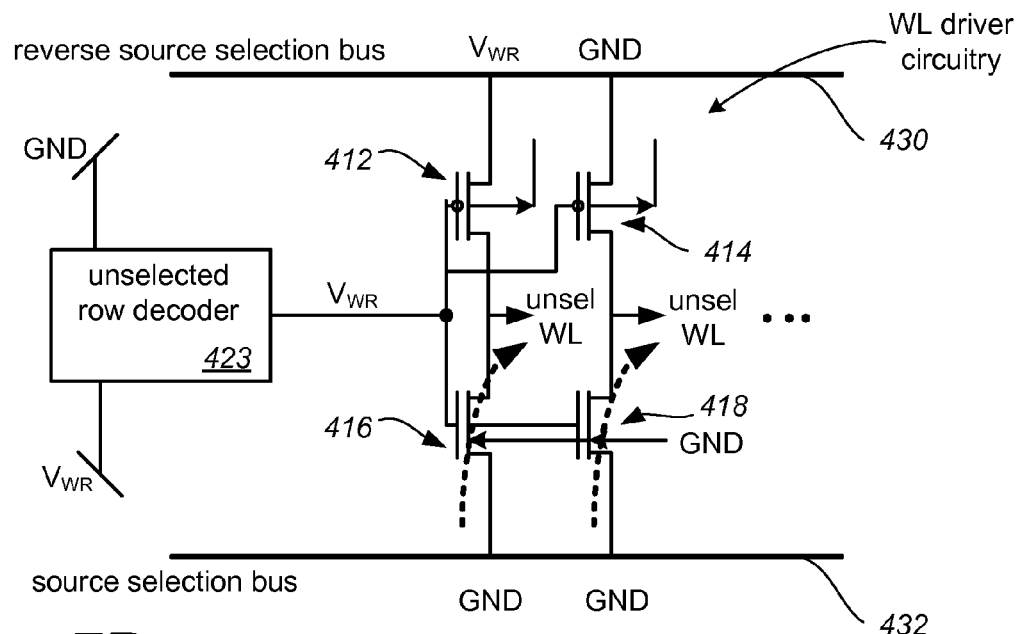

FIG. 7A depicts an embodiment of a portion of row control circuitry 220 that can be used to apply the reverse bias conditions of FIG. 6. Row decoder 422 corresponds to a selected word line during the set or reset operation and outputs ground to the NMOS/PMOS word line driver circuitry (e.g., 224 in FIG. 4). The ground input for the driver circuitry turns on the upper PMOS devices 402 and 404. The ground input causes the driver circuitry to pass the reverse source selection bus signals $V_{WR}$ and GND to the selected word line and each half-selected word line associated with decoder 422, respectively. Each row decoder 423 corresponding to an unselected word line outputs $V_{WR}$ to its respective driver circuitry, as depicted in FIG. 7B. The positive bias of $V_{WR}$ turns on the NMOS devices 416 and 418 of the driver circuitry of the unselected word lines. Accordingly, the source selection bus levels (all GND) are selected and driven on each corresponding unselected word line. In one embodiment, the word line reverse voltage $V_{WR}$ is equal to about $+\frac{1}{2}V_{RR}$ as previously described. $V_{WR}$ can provide other voltage levels as well. For example, one or more reverse voltage pulses having a sloped pulse (e.g., beginning at $+\frac{1}{2}V_{RR}$ and increasing thereafter) as described hereinafter can be provided for the operation.

Figure 8A:
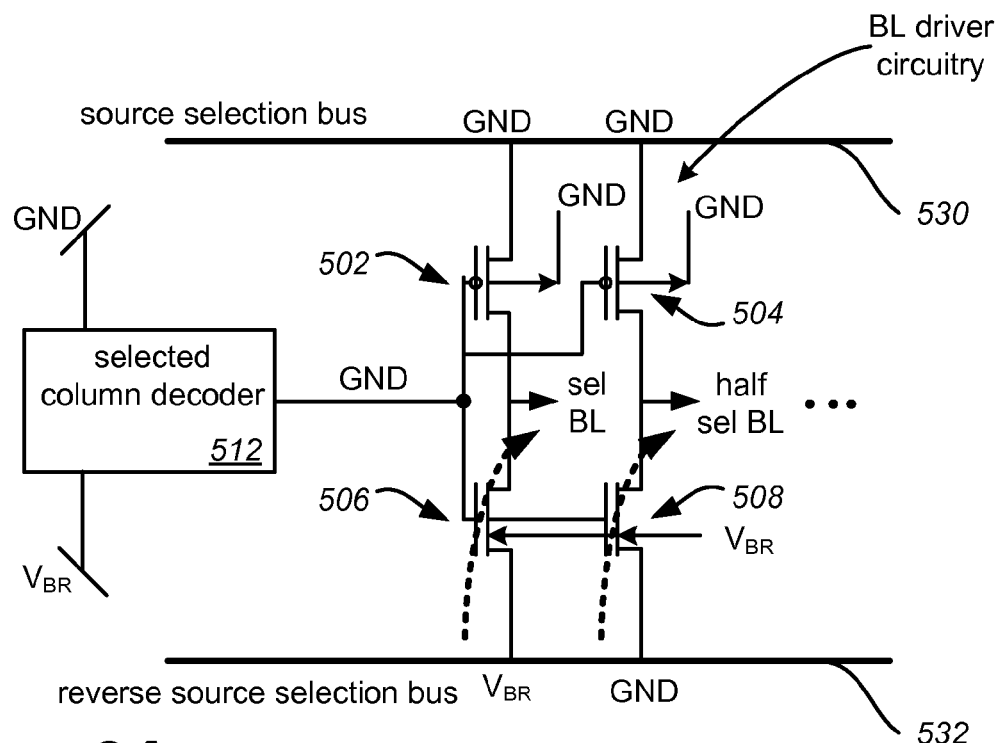
FIGS. 8A and 8B are circuit diagrams of a portion of column control circuitry that can be used in accordance with one embodiment to provide the reverse bias reset conditions of FIG. 6.
Figure 8B:
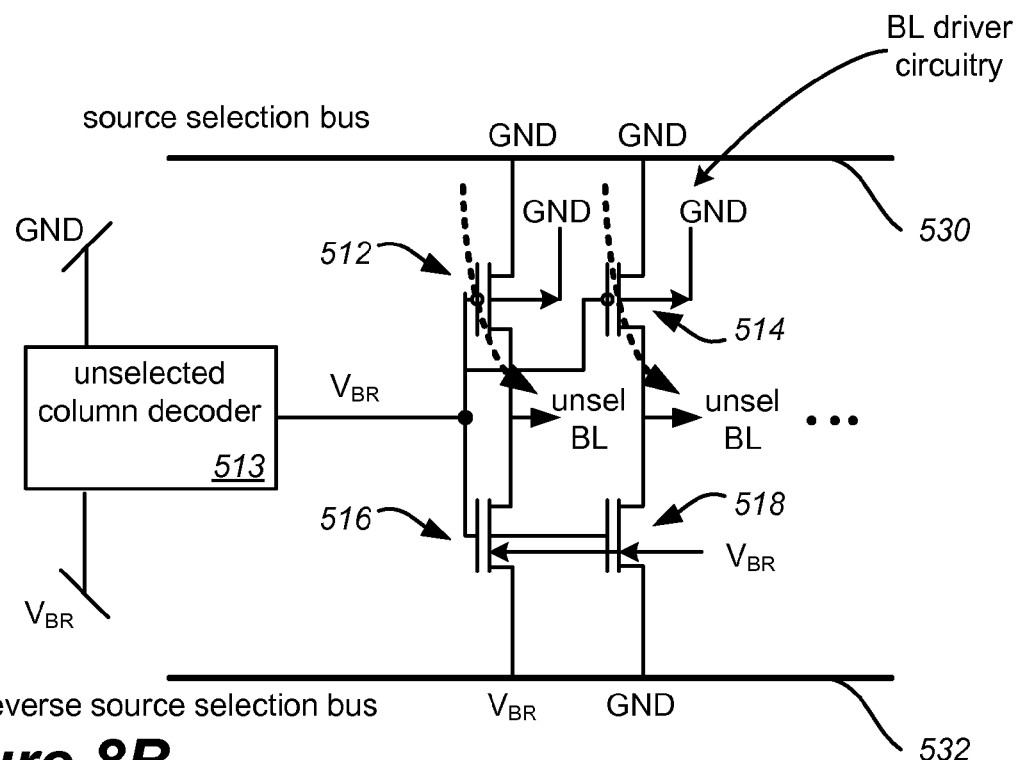

FIGS. 8A and 8B are circuit diagrams of a portion of column control circuitry 210 that can be used to apply the bias conditions for the reverse set or reset operation. Column decoder 512 controls a selected bit line driver to provide the selected bit line voltage pulse $V_{BR}$. $V_{BR}$ provides a voltage pulse of $-\frac{1}{2}V_{RR}$ in one embodiment. Column decoder 512 can be shared across multiple bit line drivers (e.g., 24) and also connect the half-selected bit lines to ground bias just prior to application of the pulses. The half-selected bit lines float near ground during the application of the pulse. The large number of unselected cells on half-selected bit lines provide a leakage current that keeps half-selected bit lines near ground. The memory cells sharing a column decoder with the selected bit line may be half-selected memory cells during an operation in one embodiment. The cells may connect to the selected word line during the operation for example. The selected column decoder 512 outputs GND to the input of the driver circuitry for the column decoder. The GND input at the NMOS/PMOS pair of the driver circuitry will turn on the lower NMOS device 506. The reverse source selection bus level $V_{BR}$ is passed to the selected bit line. Unselected row decoder 513 provides $V_{BR}$ to the gates of its respective driver circuitry, which selects the PMOS devices at the top of each driver pair. The source selection bus signal levels (all at GND) are provided to each unselected word line corresponding to decoder 513.

More details regarding driver and control circuitry for controlling a memory array, including a dual bus architecture suitable for implementing data dependent selection of both selected and unselected word and/or bit lines in one embodiment, can be found in U.S. patent application Ser. No. 11/461,352 entitled "Dual Data-Dependent Busses for Coupling Read/Write Circuits to a Memory Array," by Roy E. Scheuerlein and Luca G. Fasoli.

Differences in device characteristics can affect the erase behavior of individual memory cells within memory array 302 during the set and reset operations. Memory cells may have different dimensions that result from the fabrication process. The material compositions, for example polysilicon material, between devices may lack certain uniformity. This results in some cells that may switch resistance at a lower voltage bias and other cells that may switch resistance at a higher voltage bias, when compared with the nominal level of an average cell in the array. To adequately set or reset an array of memory cells in accordance with one embodiment of the present disclosure, including variances among individual memory cells, at least one voltage pulse applied to the selected memory cells of the array during a set or reset operation has an amplitude with a changing slope to gradually increase the bias applied to the selected memory cells. A voltage pulse having a changing amplitude can be applied under a forward bias or a reverse bias in embodiments. Cells requiring a larger reset voltage level will reset at the higher reverse bias after the amplitude of the voltage pulse has changed while cells only requiring a lower reset voltage level will reset at a smaller level of reverse bias.

This technique accommodates variances between devices while also providing an efficient process that will not damage the devices being reset. Because a single reset voltage pulse can be applied to create a range of bias conditions, time-consuming verify operations are avoided or minimized. The single pulse can be applied across each cell while the amplitude changes to increase the bias. When switching cells from low resistance to high resistance, cells that reset at lower values of the reset voltage pulse will automatically turn-off when they reset to the higher resistance state. The higher resistance after reset will decrease or stop the current flow through these devices, ensuring that they are not damaged by the higher values of reset voltage.

Figure 9A:
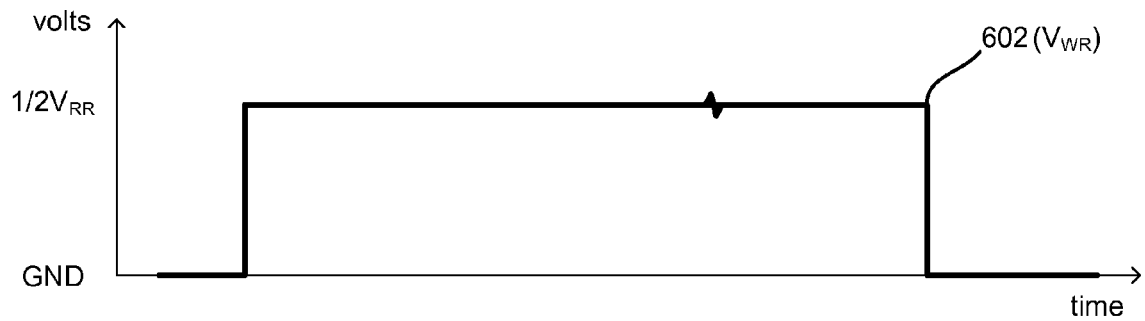
FIGS. 9A and 9B depict exemplary bit line and word line reset voltage signals in accordance with one embodiment for generating an increasing reverse bias during reset operations.
Figure 9B:
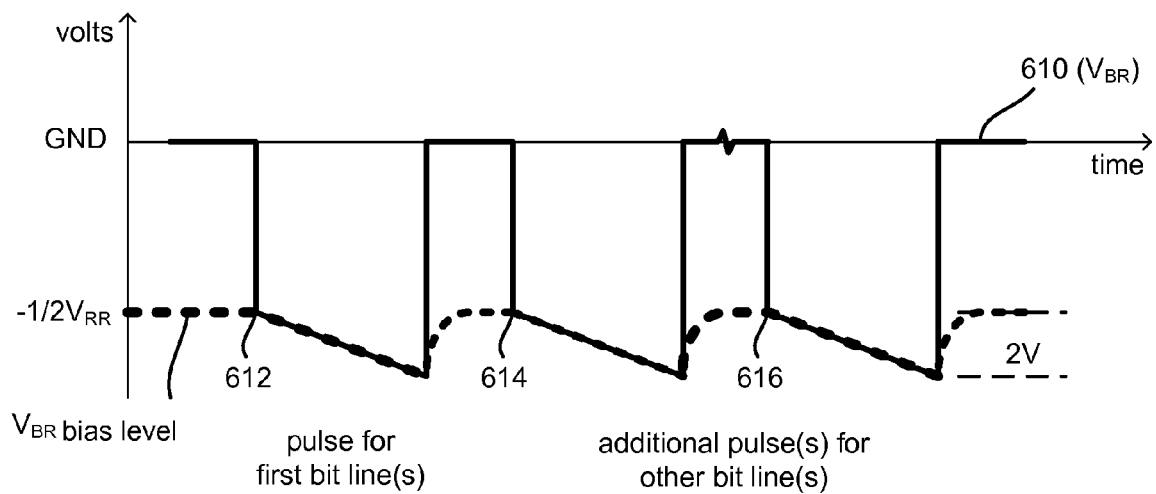

FIGS. 9A-9B depict voltage signals in accordance with one embodiment that can be applied to selected word lines and bit lines, respectively, during a reverse bias operation as shown in FIG. 6. A word line voltage signal $V_{WR}$ is depicted in FIG. 9A that rises to a maximum value of about $+\frac{1}{2}V_{RR}$ (e.g., +6V) for the duration of the portion of the operation depicted. A bit line voltage signal $V_{BR}$ is depicted in FIG. 9B having a starting value of $-\frac{1}{2}V_{RR}$ for each reset voltage pulse. The signal on the bit line has an amplitude that changes according to a substantially constant slope. In FIG. 9B, the bit line voltage signal increases from an initial value of about $-\frac{1}{2}V_{RR}$ to an ending value of about $-(\frac{1}{2}V_{RR}+2V)$. The magnitude of the amplitude for each negative bit line pulse increases by about 2V (to −8V for example) to gradually increase the reverse bias applied across the selected portion of the array. The amplitude of the $V_{BR}$ pulse is limited to the $V_{BR}$ bias level shown by the dotted line in FIG. 9B by the output of a charge pump circuit as shown in FIG. 10B. The $V_{BR}$ bias level returns to its initial value between application of the $V_{BR}$ pulses by controlling counter 712 in FIG. 10B.

With the diodes of each memory cell aligned as shown in FIG. 6 from bit line to word line, the constant value of the word line reset voltage signal and the increasing negative voltage of the bit line reset voltage signal increases the reverse bias applied to each memory cell along the selected bit line and selected word line. Multiple pulses are shown for the bit line reset voltage signal as may be used to individually reset smaller portions of the array. For example, a first reset voltage pulse may be applied to one bit line in each of several selected blocks (sub-arrays) and a second pulse applied to a second bit line in each of the several selected blocks. More reset pulses are applied to yet more bit lines until all the data supplied by the user is encoded. This technique may require 16 to 64 or more reset voltage pulses inversely dependent on how many blocks are used to store a page of user data. Other selection and grouping schemes can be used which will require different numbers of reset voltage pulses. While FIGS. 9A-9B are described with respect to a reverse bias operation, they can be applied in a forward bias scenario. For example, if the orientation of the steering element from bit line to word line in FIG. 6 were reversed, a forward bias could be applied to the cells using these pulses. In another embodiment, the polarity of one or more of the pulses can be changed to provide a forward bias.

The starting and ending values for $V_{BR}$ can vary by implementation. In one embodiment, statistical data or experimentation is used to select the optimal starting and ending values for each pulse. For example, the initial value of the pulse may be chosen to create a reverse bias determined to be the minimum any cell will need before resetting from the lower resistance state to the higher resistance state. The ending value of each pulse may be chosen to create the largest reverse bias typically needed to reset any cell of the array. By gradually applying an increasing reverse bias, the memory cells that reset at a lower reset reverse bias level can avoid being damaged at the increased reverse bias levels. When a memory cell resets to the higher resistance reset state, it will conduct less current and behave in a self-limiting manner. It will turn itself off or stop conducting to a sufficient extent when it has successfully reset. This self-limiting cutoff will avoid damage under the reverse bias conditions. It is noted that gradually increasing the amplitude of a reset pulse from a starting value to a larger ending value to thereby increase the reverse bias for selected memory cells does not have the same electrical effects as applying a constant pulse with a larger starting value. A pulse having a larger starting value may damage the material forming the resistance change element or cause a permanent shift in resistance. Therefore, one embodiment of the disclosed technology utilizes a sloped reverse reset pulse to successfully and safely erase memory cells having different device characteristics.

Figure 10A:
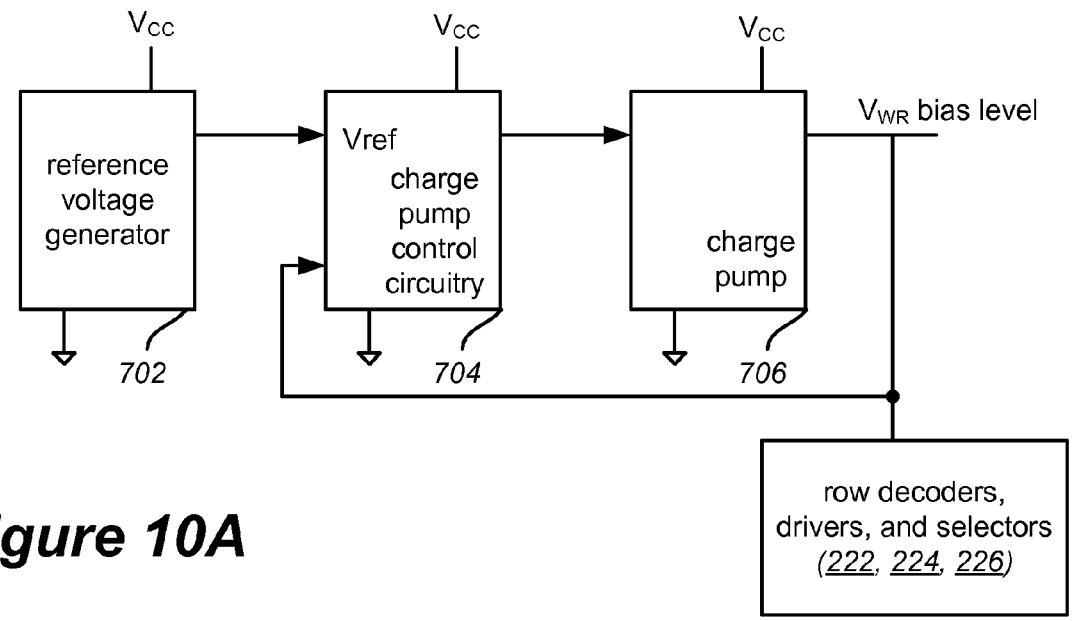
FIGS. 10A and 10B are circuit diagrams for a portion of the control circuitry that can be used to generate sloped pulse reset voltage signals as illustrated in FIGS. 9A and 9B.
Figure 10B:
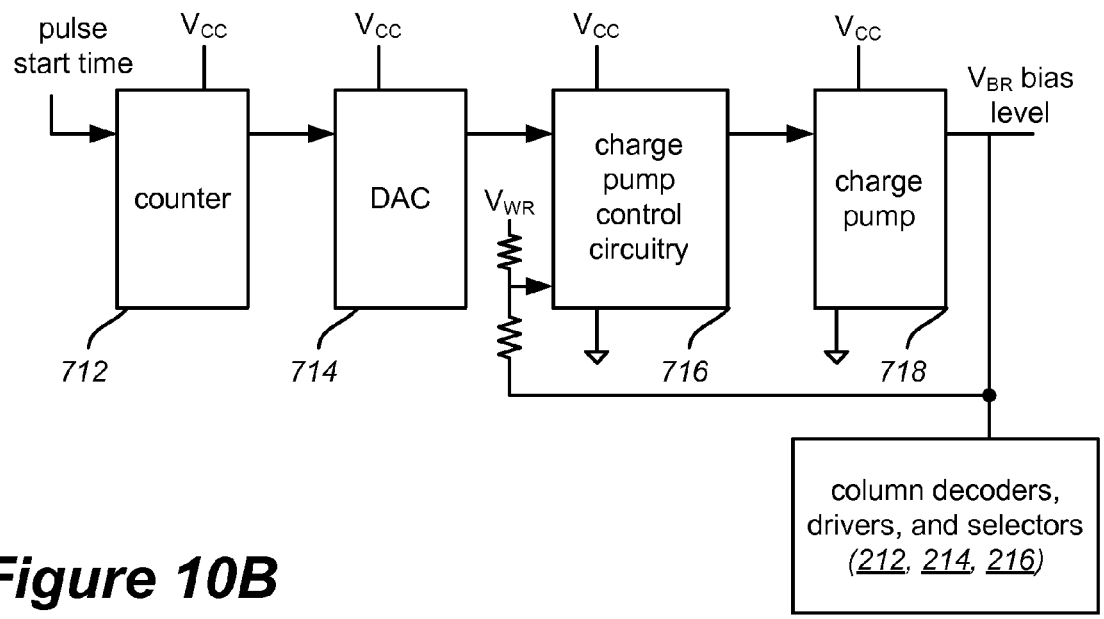

A portion of row control circuitry and column control circuitry that can provide the voltage signals of FIGS. 9A-9B are depicted in FIGS. 10A and 10B, respectively. A charge pump 706 in FIG. 10A provides the reverse reset $V_{WR}$ bias level through row circuitry including a reverse source selection bus pulse generator to the reverse source selection bus (e.g., bus 430 in FIGS. 7A-8B) and directly to row decoder circuits (e.g., decoder 222 in FIG. 4). Reference voltage generator 702 receives a supply voltage $V_{CC}$ and provides a reference voltage $V_{ref}$ to charge pump controller 704. Using a feedback signal from the output of charge pump 706, the controller can provide a starting $V_{WR}$ bias level of about $\frac{1}{2}V_{RR}$ as needed.

The column control circuitry depicted in FIG. 10B utilizes a counter 712 and digital to analog converter 714 to generate the bit line reset voltage $V_{BR}$ bias level having a negative sloped pulse output (negative level and slope). Counter 712 receives a pulse start time and using a clock signal, provides a pulsed input to DAC 714 to generate a analog sloped pulse output. DAC 714 receives the digital input and provides voltage levels to the charge pump controller. Charge pump 718 generates a negative bit line reset voltage $V_{BR}$ bias level that increases according to a substantially constant and negative slope produced from the counter. The amplitude of the negative voltage $V_{BR}$ bias level increases according the defined slope to gradually increase the reverse bias applied across the memory array.

Figure 11A:
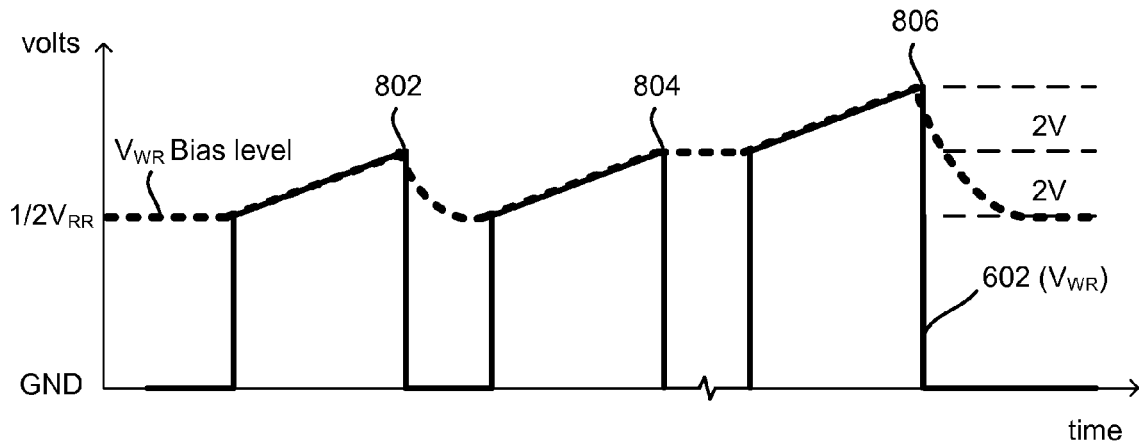
FIGS. 11A and 11B depict other exemplary bit line and word line reset voltage signals in accordance with one embodiment for generating an increasing reverse bias during reset operations.
Figure 11B:
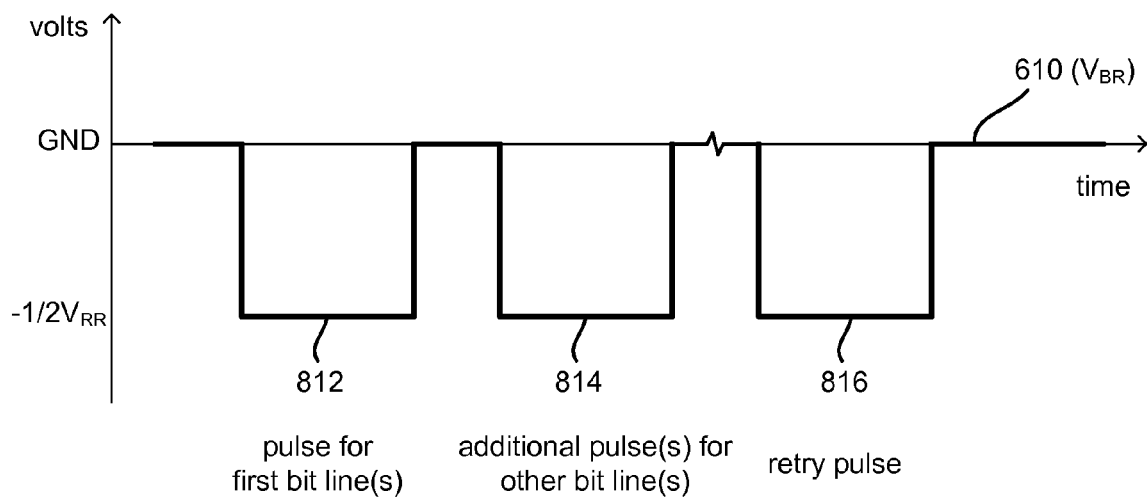

An alternative set of voltage signals for applying the reverse bias of FIG. 6 is depicted in FIGS. 11A and 11B. A positive voltage pulse $V_{WR}$ is applied to the selected word line(s) and increased according to a positive slope. A negative bit line voltage pulse $V_{BR}$ is applied on the selected bit line(s). Each word line voltage pulse begins at a starting value of about +5V and increases by 2V to around +7V. The magnitude of the $V_{WR}$ pulse is limited to the $V_{WR}$ bias level from the output of the charge pump circuit and is shown by the dotted line in FIG. 11A. The combination of the word line and bit line reset pulses will provide an increasing reverse bias across each selected memory cell. Additional bit line reset voltage pulses are depicted as may be used to set or reset additional groupings of bit lines. As with FIGS. 9A-9B, the pulses of FIGS. 11A-11B can be used to create a forward bias in some embodiments. In another embodiment, the pulses are not sloped. For example, a first voltage pulse having a negative polarity can be applied to a first array line and a second voltage pulse having a positive polarity applied to a second array line to create a reverse bias. This arrangement can also switch the resistance of the memory cells, but does not include a slope on the pulses or a resulting shift in the bias applied.

The embodiment of FIGS. 11A and 11B includes a retry technique using a slightly higher reset pulse level determined by the $V_{WR}$ bias level for memory cells that do not switch under application of the initial voltage pulse. For example, the results of resetting a selected portion of the array can be verified after applying the last reset voltage pulses 804 and 814. A verify operation can include reading back the resistive state of the memory cell and comparing it with the predefined level for the reset state. Any columns or bit lines that are not reset can be subjected to a retry pulse at a higher level. The starting value of the word line voltage pulse 806 is increased to 7V and increases to a level of 9V. The value of any retry pulse may vary by embodiment and can be selected based on statistical data and/or testing as previously described. In FIGS. 11A and 11B, the retry pulse is applied to each bit line of the array that fails to verify for a reset state. In other embodiment, a retry pulses (or multiple pulses) can be applied after individual applications of the initial reset voltage pulses. If a column or other grouping of cells fails to verify for the target resistive state after a retry pulse (or multiple retry pulses), they can be handled using error correction control techniques or replaced with redundant memory cells.

Figure 12A:
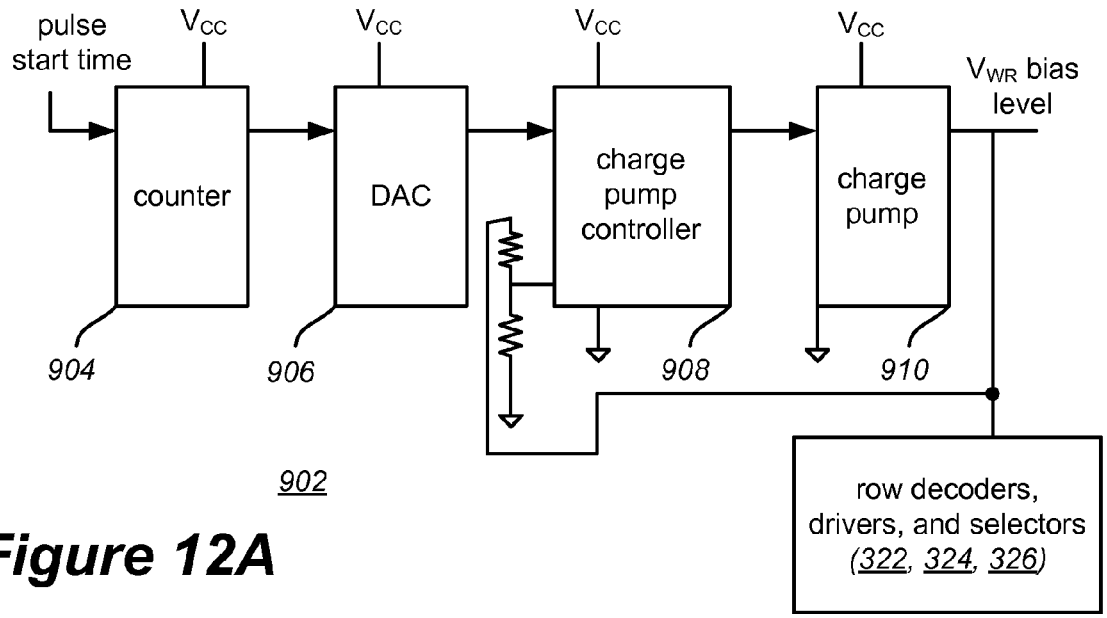
FIGS. 12A and 12B are circuit-level diagrams for a portion of control circuitry that can be used to generate sloped pulse reset signals as illustrated in FIGS. 11A and 11B.
Figure 12B:
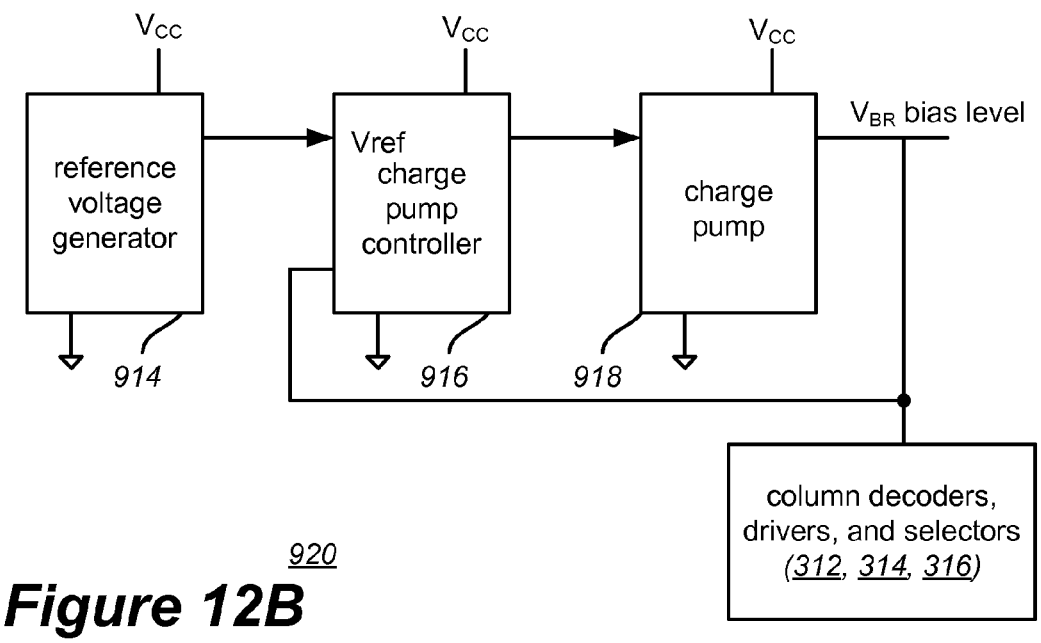

FIGS. 12A and 12B depict portions of the row and column control circuitry that can be used to provide the pulses of FIGS. 11A and 11B in accordance with one embodiment. The selected word lines provide a positive signal in this embodiment having an amplitude that increases according to a positive slope. A counter 904 and digital to analog converter 906 are utilized when driving charge pump controller 908. Controller 908 uses the analog output of DAC 906 and creates a positively sloped $V_{WR}$ bias level via charge pump 910. The output of charge pump 910 is applied directly to the word line decoders and through reverse source selection bus pulse generation circuitry to the reverse source selection bus line. A portion of the column control circuitry 210 for providing the negative $V_{BR}$ bias level is depicted in FIG. 12B. A reference voltage generator 914 delivers a reference voltage $V_{ref}$ to charge pump controller 916. The controller utilizes a feedback loop from the output of charge pump 918 to maintain a steady value of $V_{BR}$ bias level for the bit line voltage signal.

Figure 13:
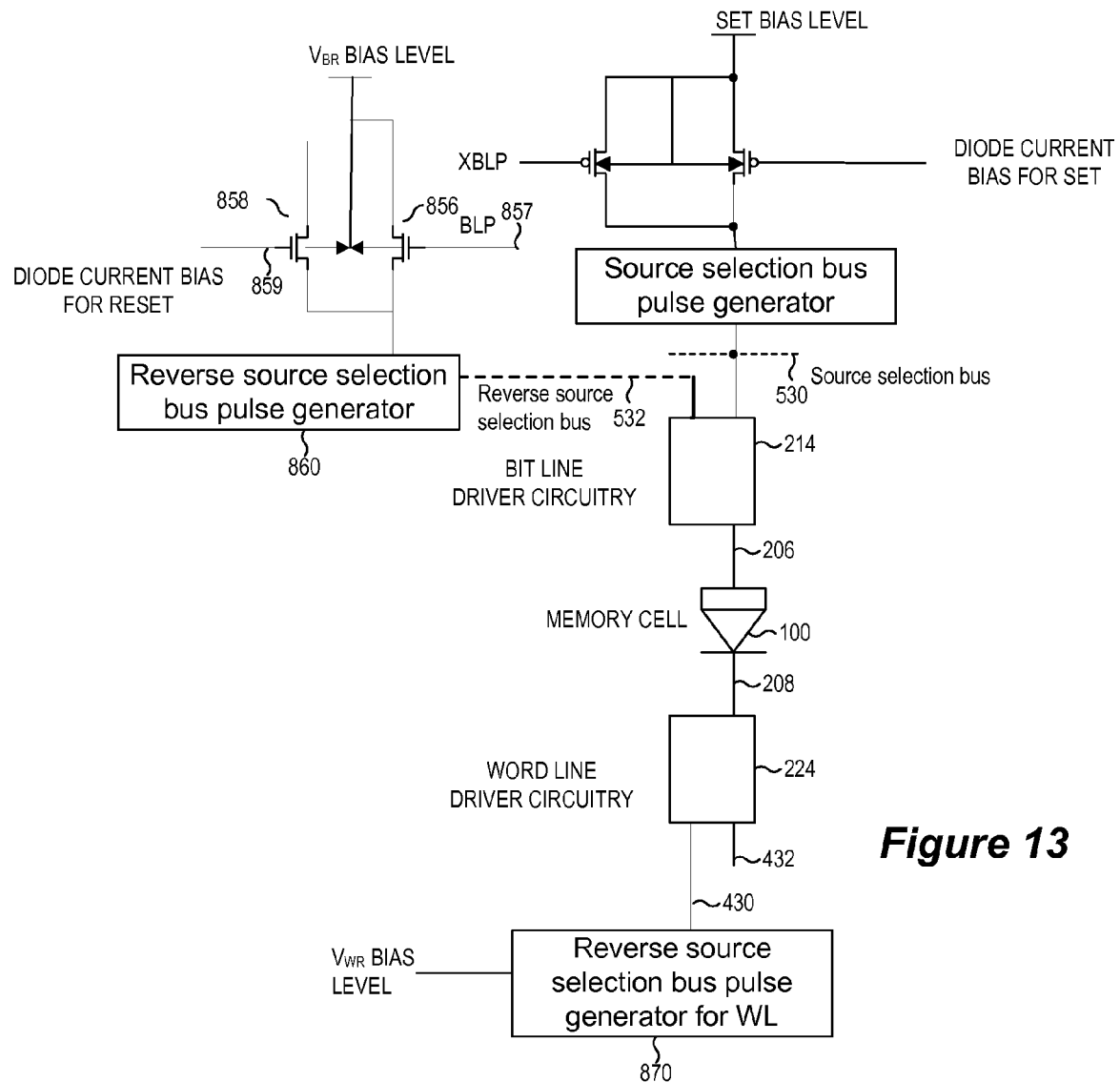
FIG. 13 is a circuit topology that can be used to provide controlled reverse bias conditions in accordance with one embodiment.

FIG. 13 depicts an exemplary circuit topology 850 as can be used for setting or resetting memory cells. In a reverse bias reset operation, for example, circuit 850 applies the reverse reset $V_{BR}$Bias Level through current limiting devices 858 and 856 to a reverse source selection bus pulse generator 860 and on to the reverse source selection bus 532. In this circuit 850, the pulse amplitude, pulse width (duration) and current limit for the selected bit line are controlled to particular values. In some embodiments, the pulse generator 860 includes snapback prevention series devices to allow the pulse control while the $V_{BR}$ Bias Level is at high voltage. A diode current bias signal 859 coupled to NMOS transistor 858 provides the desired current limit on the selected bit line. A precharge device 856 functions to precharge the selection path to enhance performance, responsive to an BLP precharge signal 857. An analogous circuit supplies the voltage denoted "Set Bias Level" and current to the bit line for the set operations. The dual bit line source selection buses sometimes referred to as SELB and SELN are described in more detail in U.S. patent application Ser. No. 11/461,352 entitled "Dual Data-Dependent Busses for Coupling Read/Write Circuits to a Memory Array."

Also as shown in FIG. 13, the reset voltage $V_{WR}$ Bias Level drives the reverse source selection bus pulse generator 870 for word lines 208. In some embodiments the pulse generator comprises snapback prevention series devices to allow the pulse control while the $V_{WR}$ Bias Level is at high voltage. The output of the pulse generator drives the reverse source selection bus for word lines 430, which drives the selected word line 208 through the word line driver circuitry 224 as prviously described. Both the pulse height and pulse width of the $V_{WR}$ pulse for the selected word line are controlled to particular values.

Figure 14:
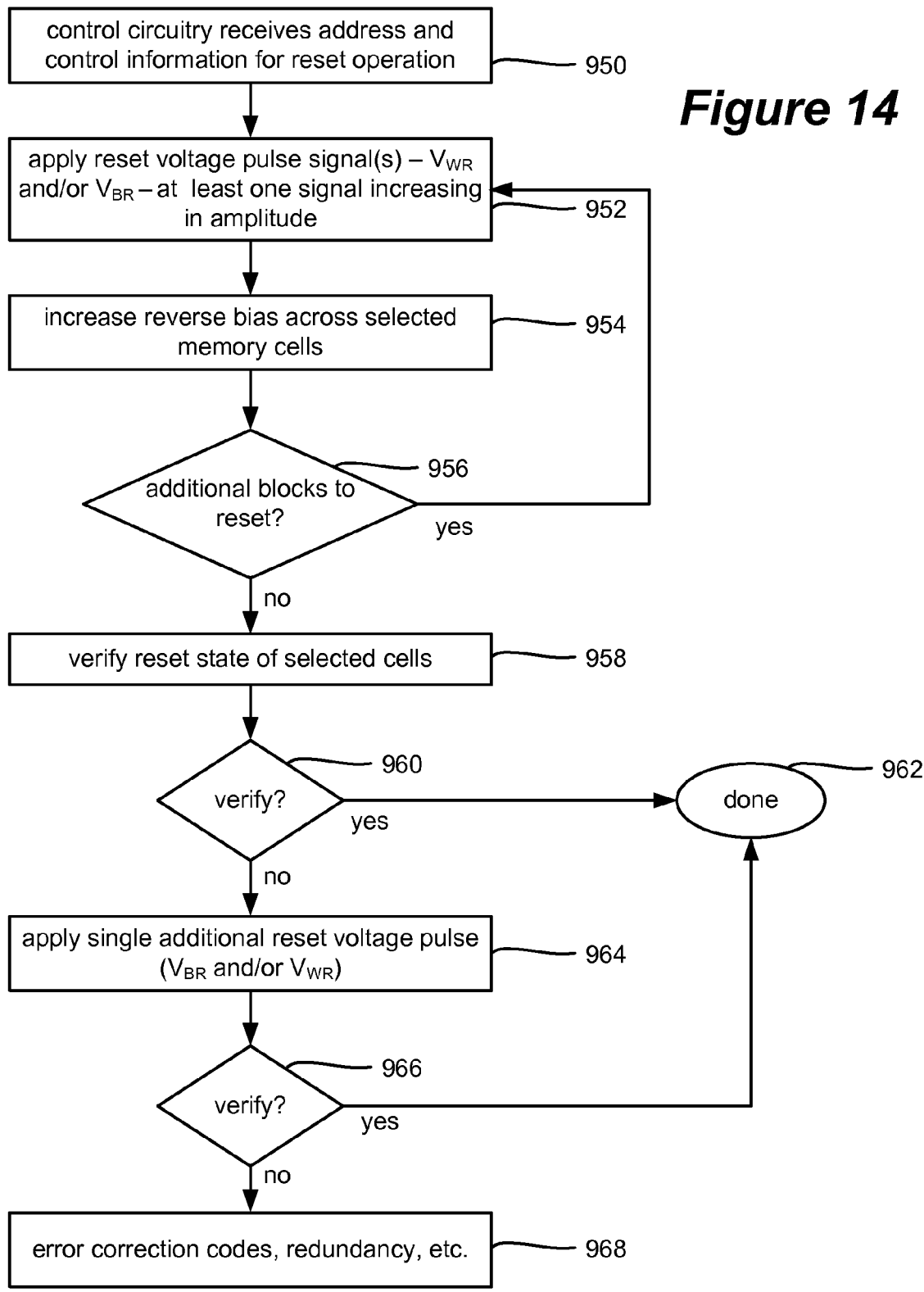
FIG. 14 is a flowchart depicting a reset operation in accordance with one embodiment.

FIG. 14 is a flowchart of a sloped pulse reverse bias reset operation in accordance with one embodiment. The method of claim 14 can also be used to provide a reverse bias set operation in one embodiment. The row and column control circuitry receive control signals as well as row and column address information, respectively, at step 950. The control circuitry selects a portion of the cells to be reset in some implementations rather than erasing a large section of selected memory cells at once. For example, some implementations may reset the memory cells of one or a few rows within one sub-array from each bay in the memory device. In other implementations, other selected sets of memory cells can be erased, including every memory cell in a sub-array, for example.

A first bit line reset voltage pulse $V_{BR}$ and/or word line reset voltage pulse $V_{WR}$ is applied at step 952. Terminal driver circuitry and block selector(s) in the control circuitry drive the appropriate levels on the selected and unselected lines at step 952. If reset voltage pulse signals $V_{WR}$ and $V_{BR}$ as shown in FIGS. 9A and 9B are used, the increasing selected word line positive voltage pulse will increase the reverse bias applied across each selected memory cell. Step 954 depicts the increasing reverse bias applied to the selected memory cells by virtue of the increasing magnitude of the reset voltage pulse(s). At step 956, it is determined if additional portions of the array are to receive an initial reset voltage pulse. If so, another pulse is applied at step 952 to the selected array lines.

If each designated cell has undergone an application of the reverse bias reset voltage provided by the selected word and bit line bias, the method proceeds to step 958 where a verification operation can be performed for each group of memory cells. Each memory cell can be read back for the designated reset state using current, voltage, or other sensing techniques. U.S. patent application Ser. No. 11/461,343 entitled "Apparatus for Reading a Multi-Level Passive Element Memory Cell Array," describes suitable reading techniques that may be used for a read back operation to verify the reset state. If any cells are not adequately reset (e.g. at a large enough resistance) as determined at step 960, their corresponding block can be flagged for application of a retry pulse at step 964. A single retry pulse is applied at an increased level at 964 in one embodiment. Multiple retry pulses can be used in other embodiments. Either the bit line reset voltage $V_{BR}$ bias level or the word line reset voltage $V_{WR}$ bias level can be increased to provide a larger reverse bias across the memory cells receiving the retry pulse. After applying the retry pulse at 964, an additional verification can optionally be performed at step 966. Error correction codes or redundancy can be used at step 968 for any cells that fail to reset after application of the retry pulse. In other embodiments, additional retry pulses may be applied at even higher levels for cells that continue to fail to reset. In some embodiments, no retry pulses are used. After verifying at step 960 and 966, or handling unverified cells at step 968, the method is complete at step 962.

In one or more embodiments, the method of FIG. 14 can be modified according to various implementation considerations. In one embodiment, the pulses applied at step 952 include a positive voltage on a first selected array line and a negative voltage on a corresponding second selected array line. These pulses may or may not have a sloped pulse. In another embodiment, the polarity of the pulses or the arrangement of the steering elements of a memory cell can be modified to a provide a forward bias operation according to the described method.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of changing resistance states in a non-volatile memory integrated circuit, comprising:
applying a first voltage pulse to a non-volatile memory cell including a steering element in series with a state change element, said first voltage pulse having a first staffing value, said non-volatile memory cell being in a first resistance state prior to applying said first voltage pulse;
changing an amplitude of said first voltage pulse at a substantially constant slope to a first ending value during said applying to increase an amount of bias applied to said non-volatile memory cell;
determining whether said non-volatile memory cell has reached a second resistance state after applying said first voltage pulse;
applying a second voltage pulse to said non-volatile memory cell if said non-volatile memory cell has not reached said second resistance state, said second voltage pulse having a second starting value;
changing an amplitude of said second voltage pulse at a substantially constant slope to a second ending value during said applying said second voltage pulse.

2. The method of claim 1, wherein:
said non-volatile memory cell is part of an array of non-volatile memory cells arranged between a plurality of first array lines and a plurality of second array lines; and
said non-volatile memory cell is coupled to a selected first array line and a selected second array line.

3. The method of claim 2, wherein:
said applying said first voltage pulse includes continuously applying a positive voltage pulse to said selected first array line while increasing an amplitude of said positive voltage pulse from a first positive voltage to a second more positive voltage; and
said method further comprises applying a fixed bias to said selected second array line while continuously applying said positive voltage pulse.

4. The method of claim 3, wherein:
applying a fixed bias to said selected second array line comprises grounding said selected second array line.

5. The method of claim 3, wherein:
applying a fixed bias to said selected second array line comprises applying a negative voltage bias to said selected second array line relative to an unselected second array line.

6. The method of claim 2, wherein:
said applying said first voltage pulse includes continuously applying a negative voltage pulse to said selected second array line while increasing an amplitude of said negative voltage pulse from a first negative voltage to a second more negative voltage; and
said method further comprises applying a fixed bias to said selected first array line while continuously applying said negative voltage pulse.

7. The method of claim 2, wherein said applying said first voltage pulse includes:
continuously applying a positive voltage pulse to said selected first array line while increasing an amplitude of said positive voltage pulse from a first positive voltage to a second more positive voltage; and
continuously applying a negative voltage pulse to said selected second array line while increasing an amplitude of said negative voltage pulse from a first negative voltage to a second more negative voltage.

8. The method of claim 1, further comprising:
applying a third voltage pulse at said first starting value to a second non-volatile memory cell after applying said first voltage pulse and before applying said second voltage pulse.

9. The method of claim 1, wherein:
said first resistance state is a lower resistance state than said second resistance state.

10. The method of claim 9, wherein:
said non-volatile memory cell is a re-writable non-volatile memory cell; and
changing said resistance includes resetting said non-volatile memory cell from said first resistance state to said second resistance state during an erase operation.

11. The method of claim 10, further comprising:
programming said non-volatile memory cell by changing a resistance of said non-volatile memory cell from said second resistance state to said first resistance state subsequent to resetting said non-volatile memory cell.

12. The method of claim 9, wherein:
said non-volatile memory cell is a one-time programmable non-volatile memory cell including an anti-fuse in addition to said steering element and said state change element;

changing said resistance is performed as part of a reset operation for said non-volatile memory cell;

said reset operation corresponds to programming said one-time programmable non-volatile memory cell; and said non-volatile memory cell is set from an initial high resistance state to said first resistance state by popping said anti-fuse during a manufacturing process.

13. The method of claim 1, wherein:

said steering element is a diode formed of at least one polysilicon layer;

at least a portion of said at least one polysilicon layer forms said state change element; and changing said resistance includes changing a resistivity of said at least a portion of said at least one polysilicon layer.

14. The method of claim 1, wherein:

said state change element is formed from at least one metal oxide.

15. The method of claim 1, wherein:

said non-volatile memory cell includes more than two states.

16. A method of changing resistance states in a non-volatile memory integrated circuit, comprising:

applying voltage pulses to a non-volatile memory cell including a steering element in series with a state change element, said non-volatile memory cell is part of an array of non-volatile memory cells arranged between a plurality of first array lines and a plurality of second array lines, said non-volatile memory cell is coupled to a selected first array line and a selected second array line, said applying includes applying a positive voltage pulse to said selected first array line and applying a negative voltage pulse to said selected second array line;

changing an amplitude of said voltage pulses during said applying to increase an amount of bias applied to said non-volatile memory cell, said changing an amplitude includes increasing an amplitude of said positive voltage pulse from a first positive voltage to a second more positive voltage and increasing an amplitude of said negative voltage pulse from a first negative voltage to a second more negative voltage.

17. The method of claim 16, wherein:

said first resistance state is a lower resistance state than said second resistance state.

18. The method of claim 17, wherein:

said non-volatile memory cell is a re-writable non-volatile memory cell; and changing said resistance includes resetting said non-volatile memory cell from said first resistance state to said second resistance state during an erase operation.

19. The method of claim 18, further comprising:

programming said non-volatile memory cell by changing a resistance of said non-volatile memory cell from said second resistance state to said first resistance state subsequent to resetting said non-volatile memory cell.

20. The method of claim 17, wherein:

said non-volatile memory cell is a one-time programmable non-volatile memory cell including an anti-fuse in addition to said steering element and said state change element;

changing said resistance is performed as part of a reset operation for said non-volatile memory cell;

said reset operation corresponds to programming said one-time programmable non-volatile memory cell; and said non-volatile memory cell is set from an initial high resistance state to said first resistance state by popping said anti-fuse during a manufacturing process.

21. The method of claim 16, wherein:

said steering element is a diode formed of at least one polysilicon layer;

at least a portion of said at least one polysilicon layer forms said state change element; and changing said resistance includes changing a resistivity of said at least a portion of said at least one polysilicon layer.

22. The method of claim 16, wherein:

said state change element is formed from at least one metal oxide.

23. The method of claim 16, wherein:

said non-volatile memory cell includes more than two states.

* * * * *

UNITED STATES PATENT AND TRADEMARK OFFICE
CERTIFICATE OF CORRECTION

PATENT NO. : 7,522,448 B2 Page 1 of 1
APPLICATION NO. : 11/461393
DATED : April 21, 2009
INVENTOR(S) : Scheuerlein et al.

It is certified that error appears in the above-identified patent and that said Letters Patent is hereby corrected as shown below:

Col. 17, line 51: After "first" and before "value," delete "staffing" and substitute -- starting --

Signed and Sealed this

Twenty-ninth Day of September, 2009

David J. Kappos
*Director of the United States Patent and Trademark Office*